(12) United States Patent
Cho et al.

(10) Patent No.: US 12,200,154 B2
(45) Date of Patent: Jan. 14, 2025

(54) ELECTRONIC DEVICE INCLUDING FLEXIBLE PRINTED CIRCUIT BOARD

(71) Applicant: Samsung Electronics Co., Ltd., Suwon-si (KR)

(72) Inventors: Sunggun Cho, Suwon-si (KR); Bokgyu Song, Suwon-si (KR); Wonhee Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 376 days.

(21) Appl. No.: 17/738,550

(22) Filed: May 6, 2022

(65) Prior Publication Data

US 2023/0007114 A1 Jan. 5, 2023

Related U.S. Application Data

(63) Continuation of application No. PCT/KR2022/004459, filed on Mar. 29, 2022.

(30) Foreign Application Priority Data

Jul. 2, 2021 (KR) .................. 10-2021-0087457

(51) Int. Cl.
*H05K 1/00* (2006.01)
*H04M 1/02* (2006.01)
(Continued)

(52) U.S. Cl.
CPC ....... *H04M 1/0277* (2013.01); *H04M 1/0216* (2013.01); *H04M 1/0268* (2013.01);
(Continued)

(58) Field of Classification Search
CPC ............ H04M 1/0277; H04M 1/0216; H04M 1/0268; H05K 1/0281; H05K 1/0283; H05K 1/189
(Continued)

(56) References Cited

U.S. PATENT DOCUMENTS

2009/0250261 A1* 10/2009 Hayashi ............... H05K 9/0015
174/377
2010/0212953 A1 8/2010 Hayashi et al.
(Continued)

FOREIGN PATENT DOCUMENTS

CN 103313504 B * 12/2015
CN 207251713 U 4/2018
(Continued)

OTHER PUBLICATIONS

International Search Report and Written Opinion dated Jul. 6, 2022, issued in International Patent Application No. PCT/KR2022/004459.
Extended European Search Report dated Sep. 23, 2024; European Appln. No. 22833360.5-1218 / 4297539 PCT/KR2022004459.

*Primary Examiner* — Zhengfu J Feng
(74) *Attorney, Agent, or Firm* — Jefferson IP Law, LLP

(57) ABSTRACT

An electronic device is provided. The electronic device includes a first housing including a first through hole, a flexible printed circuit board including a plurality of layers, a first portion of the flexible printed circuit board disposed to pass through the through hole, a bonding member being disposed between the plurality of layers constituting the first portion, and a waterproofing member formed to surround at least part of the first portion of the flexible printed circuit board.

20 Claims, 25 Drawing Sheets

(51) Int. Cl.
*H05K 1/02* (2006.01)
*H05K 1/18* (2006.01)
(52) U.S. Cl.
CPC ......... *H05K 1/0281* (2013.01); *H05K 1/0283* (2013.01); *H05K 1/189* (2013.01)
(58) Field of Classification Search
USPC .................................................. 361/679.01
See application file for complete search history.

(56) References Cited

U.S. PATENT DOCUMENTS

| | | | |
|---|---|---|---|
| 2011/0181003 A1* | 7/2011 | Hayashi | H05K 5/069 277/630 |
| 2013/0062837 A1 | 3/2013 | Sasaki | |
| 2013/0206445 A1* | 8/2013 | Miura | H01R 12/77 174/70 R |
| 2020/0060020 A1 | 2/2020 | Park et al. | |
| 2020/0162596 A1* | 5/2020 | Kim | G06F 1/1616 |
| 2022/0129046 A1 | 4/2022 | Baek et al. | |

FOREIGN PATENT DOCUMENTS

| | | |
|---|---|---|
| JP | 2004-214927 A | 7/2004 |
| JP | 2006-344813 A | 12/2006 |
| JP | WO2012/008311 A1 | 9/2013 |
| JP | 2015-026343 A | 2/2015 |
| KR | 10-1575940 B1 | 12/2015 |
| KR | 10-1670890 B1 | 10/2016 |
| KR | 10-1786545 B1 | 10/2017 |
| KR | 10-2020-0057236 A | 5/2020 |
| KR | 10-2020-0100490 A | 8/2020 |
| KR | 10-2021-0017097 A | 2/2021 |

* cited by examiner

ELECTRONIC DEVICE INCLUDING FLEXIBLE PRINTED CIRCUIT BOARD

CROSS-REFERENCE TO RELATED APPLICATION(S)

This application is a continuation application, claiming priority under § 365(c), of an International application No. PCT/KR2022/004459, filed on Mar. 29, 2022, which is based on and claims the benefit of a Korean patent application number 10-2021-0087457, filed on Jul. 2, 2021, in the Korean Intellectual Property Office, the disclosure of which is incorporated by reference herein in its entirety.

TECHNICAL FIELD

The disclosure relates to an electronic device including a flexible printed circuit board (FPCB).

BACKGROUND ART

Electronic device may mean a device performing a particular function according to its equipped program, such as a home appliance, an electronic scheduler, a portable multimedia player, a mobile communication terminal, a tablet personal computer (PC), a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling or e-wallet function. Such electronic devices become compact enough for users to carry in a convenient way.

As mobile communication services spread up to multimedia services, users may use multimedia services as well as voice calls or text messaging, on their electronic device. To rid the user of any inconvenience in using multimedia services, a trend is to pack an electronic device with a larger display panel. Recently, flexible display panel-equipped foldable electronic devices come along.

The above information is presented as background information only to assist with an understanding of the disclosure. No determination has been made, and no assertion is made, as to whether any of the above might be applicable as prior art with regard to the disclosure.

DISCLOSURE

Technical Problem

An electronic device may include a housing and may include a plurality of inner spaces (e.g., a waterproof area and a non-waterproof area) defined by structures disposed inside the housing. The electronic device may include various electronic components for performing various functions and operations, such as communication, entertainment, multimedia, security, etc., and among these electronic components, important electrical components may be disposed in the waterproof area considering the interface for user convenience, product regulations, and spatial arrangement in electronic devices. Electronic components, such as a printed circuit board (PCB), disposed in the waterproof area may be electrically coupled through at least one flexible printed circuit board (FPCB). A through hole or an opening through which the flexible printed circuit board passes may be formed in at least partial area of the inner walls (e.g., the wall of the housing) surrounding the waterproof area, and a waterproofing member implemented with an elastic material is provided in the insertion portion of the flexible printed circuit board passing through the through hole so that the space between the through hole and the insertion portion of the flexible printed circuit board may be closed and waterproofed by the waterproofing member. However, since the rigidity of the flexible printed circuit board is significant, if external force is applied to the waterproofing member coupled in the through hole, the waterproofing member may be deformed, forming a gap between the through hole and the insertion portion of the flexible printed circuit board and thus causing a fluid (e.g., water) to enter the waterproof area. Further, if the flexible printed circuit board is implemented with several overlapping sheets of flexible printed circuit boards or to include a plurality of conductive layers, the insertion portion of the flexible printed circuit board into the through hole may be bent, causing inter-layer peel-off and resultantly a gap through which a fluid (e.g., water) may be introduced into the waterproof area.

Aspects of the disclosure are to address at least the above-mentioned problems and/or disadvantages and to provide at least the advantages described below. Accordingly, an aspect of the disclosure is to provide an electronic device for providing a flexible printed circuit board including a reinforced portion which is inserted into a through hole with a relatively larger width than other portions of the flexible printed circuit board, thereby providing rigidity to the waterproofing member, which hangs down in the shape of a cantilever, and reducing deformation due to external force to thereby enhance the waterproofness of the waterproof area.

Another aspect of the disclosure is to provide an electronic device for providing a reinforced portion of a flexible printed circuit board including a predetermined bonding member between a plurality of layers, reducing inter-layer peel-off and enhancing the rigidity of the reinforced portion by the bonding member, and thus enhancing the waterproofness of the waterproof area.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a first housing including a first through hole, a flexible printed circuit board including a plurality of layers, a first portion of the flexible printed circuit board being disposed to pass through the first through hole, a bonding member being disposed between the plurality of layers constituting the first portion, and a waterproofing member formed to surround at least part of the first portion of the flexible printed circuit board.

In accordance with another aspect of the disclosure, an electronic device is provided. The electronic device includes a first housing including a first through hole, a second housing including a second through hole, a flexible printed circuit board (FPCB) including a plurality of layers and including a first portion passing through the first through hole and a second portion passing through the second through hole, a bonding member being disposed between the plurality of layers of the first portion and the second portion, a first waterproofing member formed to surround the at least first portion of the flexible printed circuit board, and a second waterproofing member formed to surround the at least second portion of the flexible printed circuit board.

Advantageous Effects

According to various embodiments, an electronic device that may provide a flexible printed circuit board including a reinforced portion which is inserted into a through hole with a relatively larger width than other portions of the flexible printed circuit board, thereby providing rigidity to the waterproofing member, which hangs down in the shape of a cantilever, and reducing deformation due to external force to thereby enhance the waterproofness of the waterproof area is provided.

According to various embodiments, an electronic device that may provide a reinforced portion of a flexible printed circuit board including a predetermined bonding member between a plurality of layers, reducing inter-layer peel-off and enhancing the rigidity of the reinforced portion by the bonding member, and thus enhancing the waterproofness of the waterproof area is provided.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
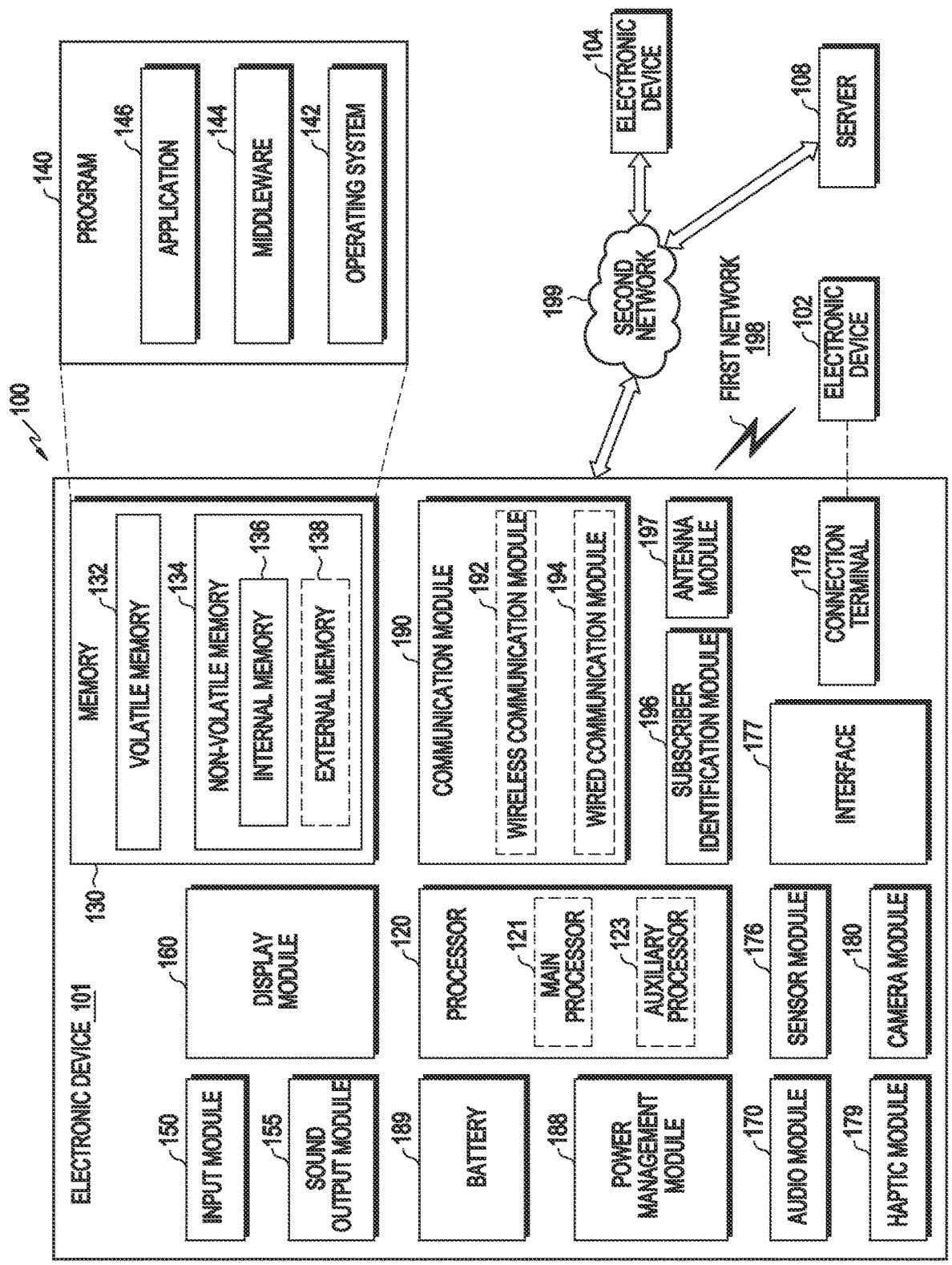
FIG. 1 is a view illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a $5^{th}$ generation (5G) network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a $4^{th}$ generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smart phone), a computer device, a portable multimedia device, a portable medical device, a camera, an electronic device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
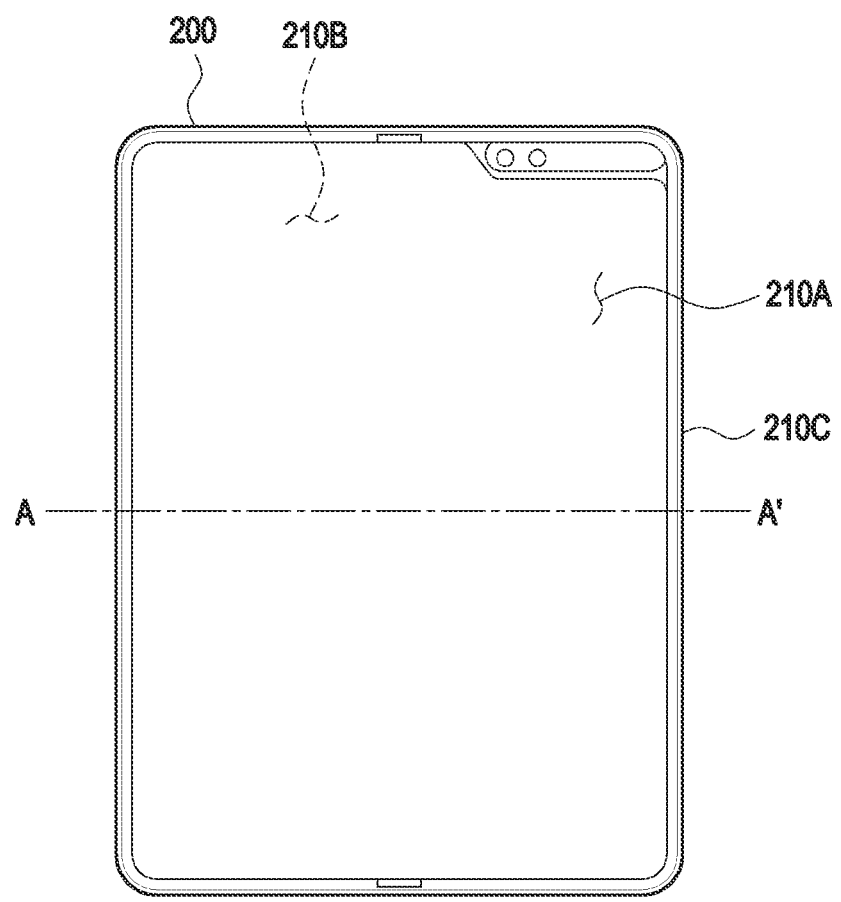
FIG. 2A is a view illustrating an example of an electronic device including a plurality of areas (e.g., a waterproof area and a non-waterproof area) according to an embodiment of the disclosure.
Figure 2B:
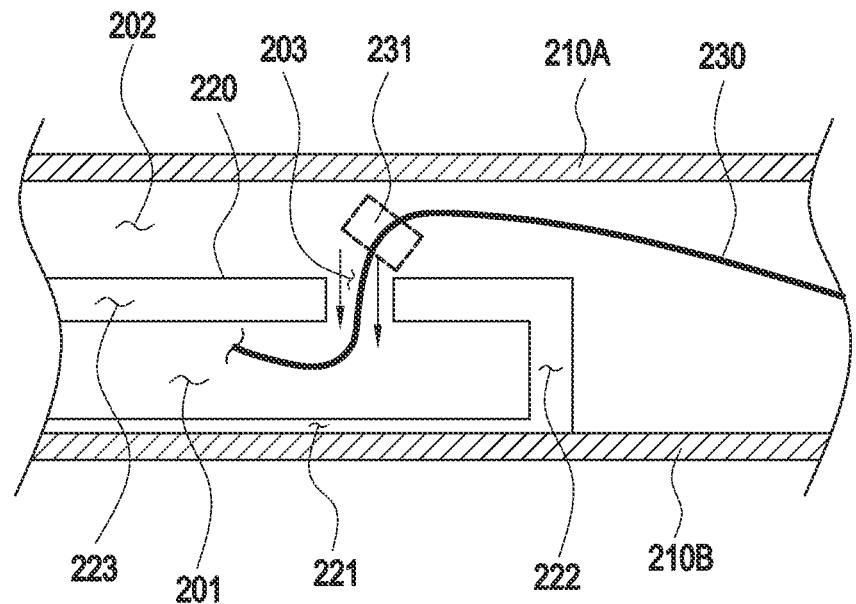
FIG. 2B is a view illustrating an example in which an electrical connecting member (e.g., a flexible printed circuit board) is disposed in a plurality of areas (e.g., a waterproof area and a non-waterproof area) according to an embodiment of the disclosure.
Figure 2B:
Figure 2B:
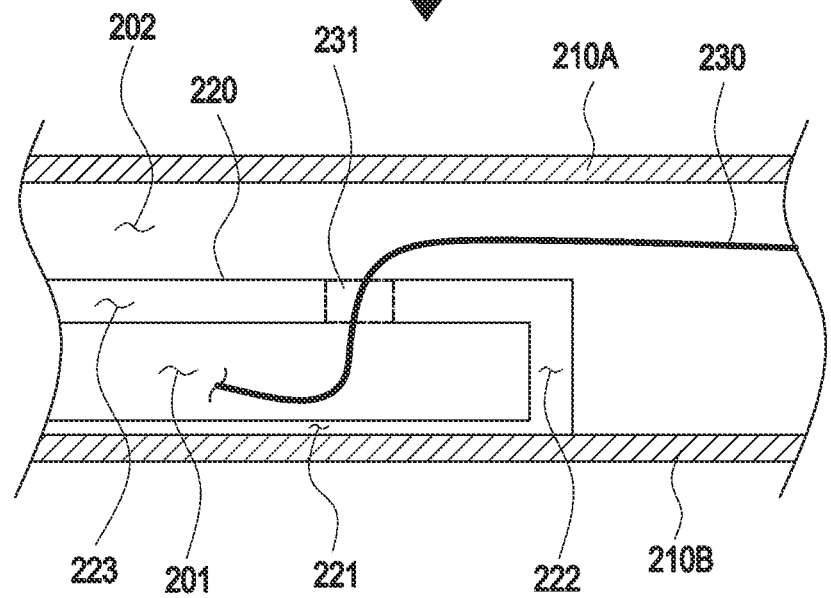

FIG. 2A is a view illustrating an example of an electronic device 200 including a plurality of areas (e.g., a waterproof area 201 and a non-waterproof area 202) according to an embodiment of the disclosure. FIG. 2B is a view illustrating an example in which an electrical connecting member (e.g., a flexible printed circuit board (FPCB) 230 (or flexible circuit board)) is disposed in a plurality of areas (e.g., a waterproof area 201 and a non-waterproof area 202) according to an embodiment of the disclosure.

Since the description of the electronic device 200 described in connection with FIG. 1 may be applied to the electronic device 200 described below, no duplicate description is given.

According to various embodiments, referring to FIG. 2A, an electronic device 200 may include a front surface 210A, a rear surface 210B, and a side surface 210C surrounding a space between the front surface 210A and the rear surface 210B. In an embodiment, the at least one structure may be included in an inner space defined by the front surface 210A, the rear surface 210B, and the side surface 210C. Referring to FIG. 2B, the at least one structure may include a housing 220. The housing 220 may include a single housing or a plurality of housings that may be coupled to each other (e.g., rotatably coupled) (e.g., housing structures described below in connection with FIGS. 4A to 4C, and/or 6A to 6C). In an embodiment, the at least one structure may replace at least some of the surfaces (e.g., upper surface, lower surface, side surface) of the housing 220 or other structures (e.g., a rear cover 221 and/or hinge cover 222, bracket 223 described below) assembled. Further, without limited to the described shapes or combination, it may also be implemented as a combination and/or coupling of structures or in other shapes. For example, the housing 220 may be a structure configured by coupling the rear cover 221, the hinge cover 222, and the bracket 223 to be described below. FIG. 2B shows an example of a portion of the cross section taken along line A-A'. Referring to FIG. 2B, the rear cover 221 may be configured as a lower portion of the housing 220, the hinge cover 222 may be configured as at least a portion of a side portion of the housing 220, and the bracket 223 may be configured as an upper portion of the housing 220. The remaining side surface 210C portions may be formed by the outer wall of the housing 220. Thus, an inner space 201 (e.g., a waterproof area described below) may be formed between the lower surface 220A (or inner surface) (e.g., the lower surface of the bracket 223) of the upper portion of the housing 220 and the upper surface 220B (or inner surface) (e.g., the upper surface of the rear cover 221) of the lower portion of the housing 220. For ease of description, some portions (e.g., the upper portion, side portion, and lower portion) of the housing 220 described below may mean portions (e.g., the rear cover 221, the hinge cover 222, or the bracket 223) constituting the housing 220 or portions of the single housing 220.

According to various embodiments, the space (e.g., the inner space defined by the front surface 210A, the rear surface 210B, and the side surface 210C) formed inside the electronic device 200 may include a plurality of areas 201 and 202 (or a plurality of spaces) and may include an electrical connecting member (e.g., the flexible printed circuit board (FPCB) 230 described below) disposed in each area 201 and 202 (or spaces). For example, referring to 202 of FIG. 2B, the space formed inside the electronic device 200 may include a first area 201 (or space) (e.g., waterproof area) and a second area 202 (or space) (e.g., non-waterproof area) and may include an electrical connecting member disposed in each area (e.g., the first area 201 and the second area 202). Without limited to those described and/or shown, various types of electric components may be disposed inside the electronic device 200, and the electric components may include the components of the electronic device 200 described in connection with FIG. 1. Hereinafter, examples of a plurality of areas (e.g., the waterproof area 201 and the non-waterproof area 202) formed inside the electronic device 200 and an electrical connecting member (e.g., the flexible printed circuit board 230) are described.

According to various embodiments, the plurality of areas 201 and 202 (e.g., the waterproof area 201 and the non-waterproof area 202) of the electronic device 200 may be implemented by at least a portion (e.g., a wall 222 of an upper portion (or bracket 223), lower portion (or rear cover 221), and/or side portion (or hinge structure (not shown)) of the housing 220) of at least one structure disposed inside the electronic device 200. In an embodiment, referring to 202 of FIG. 2B, the structure may be a wall 222 forming the upper portion (or bracket 223), lower portion (or rear cover 221), and/or side portion (or hinge structure (not shown)) of the housing 220 positioned inside the electronic device 200, and the wall of the housing 220 may include at least one through hole 203 (or opening) (or the through hole 203 may be formed in the wall of the housing 220). As the inner space of the electronic device 200 is divided by the inner wall of the housing 220, the plurality of areas 201 and 202 (or a plurality of spaces) may be implemented (or formed). As an example, a space surrounded by the lower surface 220A (or inner surface) of the upper portion (or lower surface of the bracket 223) of the housing 220, the upper surface 220B (or inner surface) of the lower portion (or the upper surface of the rear cover 221) of the housing 220, and/or the inner surface 220 of the side portion of the housing 220, of the inner space of the electronic device 200, may be the first area 201 (e.g., waterproof area). As another example, a space formed outward of the outer surface 220A (or upper surface) of the upper portion (or bracket 223) of the housing, of the inner space of the electronic device 200, may be the second area 202 (e.g., non-waterproof area) (or a space between the outer surface 220A of the upper portion of the housing 220 and the upper surface 210A of the electronic device 200 (or space between it and the lower surface 220B of the display panel (not shown) disposed on the upper surface 210). A through hole 203 (or opening) may be formed in the wall of the housing 220 between the areas (e.g., the waterproof area 201 and the non-waterproof area 202), and the electrical connecting member (e.g., the flexible printed circuit board 230) may be disposed in the areas (e.g., the waterproof area 201 and the non-waterproof area 202) through the through hole 203. A predetermined waterproofing member 231 (or sealing member) may be disposed between the through hole 203 and the electrical connecting member (e.g., the flexible printed circuit board 230), filling the gap (e.g., through hole 203) through which a predetermined liquid may infiltrate to the waterproof area 201. Accordingly, the first area 201 (e.g., the waterproof area 201) may be waterproofed. For example, the first area 201 (e.g., the waterproof area 201) may be surrounded and waterproofed by the inner surface 210C of the inner wall of the housing 220, the upper surface 210C of the lower surface, and the waterproofing member 231 filling the through hole 203 and the electrical connecting member. Meanwhile, unlike the first area 201, the second area 202 (e.g., the non-waterproof area 202) may allow infiltration of a predetermined liquid but, without limited to those described, may be waterproofed by other structures. In another embodiment, without limited to those described and/or shown, the waterproof area 201 and the non-waterproof area 202 may be implemented by at least one barrier formed inside the electronic device 200, and the electrical connecting member (e.g., the flexible printed circuit board 230) may be disposed in the two areas through the through hole 203 (or opening) formed in the at least one barrier. For example, the space surrounded by the barrier inside the electronic device 200 may be the waterproof area 201 (or space), and the space implemented outside the at least one barrier from the waterproof area 201 may be the non-waterproof area 202 (or space). An example of a structure in which the plurality of areas 201 and 202 and the electrical connecting member formed in the inner space of the electronic device 200 are disposed is further described below in connection with FIGS. 5A, 5B, and 7A to 7C.

According to various embodiments, the electrical connecting member may be implemented of a flexible material and may include at least one pattern or wire (e.g., a metal pattern or metal wire) for electrically connecting different electric components (e.g., printed circuit boards (PCBs)). For example, the electrical connecting member may include a single printed circuit board (FPCB) 230 or several overlapping flexible printed circuit boards 230 but, without limited to those described, may include various types of electrical connecting members (e.g., wires or electrodes) for electrically connecting electric components. As described above, referring to 202 of FIG. 2B, a specific portion 231B (hereinafter, reinforcement portion (reinforcement portion 330 of FIGS. 3A to 3E)) of the at least one flexible printed circuit board 230 may pass through the through hole 203 which divides the waterproof area 201 and the non-waterproof area 202, and a portion connected to the specific portion 231B may be disposed in the non-waterproof area 202 while another portion (or one end 231A) may be disposed in the waterproof area 201. A predetermined waterproofing member 231 (or sealing member) may be provided to surround the specific portion 231B (hereinafter, reinforcement portion (reinforcement portion 330 of FIGS. 3A to 3F)). Thus, the gap between the reinforcement portion of the at least one flexible printed circuit board 230 and the through hole 203 may be filled with the waterproofing member 231. The reinforcement portion (e.g., the reinforcement portion 330 described below in connection with FIGS. 3A to 3F) of the at least one flexible printed circuit board 230 may be manufactured specially as compared with the rest. For example, a plurality of layers (e.g., a plurality of layers of a single flexible printed circuit board 230 or a plurality of overlapping flexible printed circuit boards 230) of the reinforcement portion (e.g., the reinforcement portion 330 described below in connection with FIGS. 3A to 3F) may be bonded by the bonding member. As another example, the width of the reinforcement portion (e.g., the reinforcement portion 330 described below in connection with FIGS. 3A to 3F) may be implemented to be larger than the width of the rest. As another example, the reinforcement portion may be provided with various types of reinforcing members. Examples of the at least one flexible printed circuit board 230 and the reinforcement portion (e.g., the reinforcement portion 330 described below in connection with FIGS. 3A to 3F) are described below in detail with reference to FIGS. 3A to 3F.

Meanwhile, according to various embodiments, the electronic device 200 may be implemented as various types of electronic devices 200 that include the plurality of above-described areas 201 and 202 (e.g., the waterproof area 201 and the non-waterproof area 202) inside the electronic device 200 and include the electrical connecting member (e.g., the flexible printed circuit board 230) in the plurality of areas 201 and 202. For example, the electronic device 200 may include a foldable electronic device 200 and may include an electrical connecting member (e.g., the flexible printed circuit board 230) that electrically connects electric components (e.g., printed circuit boards) disposed in each of the waterproof areas 201 implemented in the foldable electronic device 200. An example in which the electronic device 200 is a foldable electronic device 200 is described below in detail. Further, without limited to those described, the electronic device 200 may be implemented as various types of electronic devices 200. Thus, it may be understood by those skilled in the art that the following description is also applicable to other types of electronic devices 200 than the foldable electronic device 200.

Hereinafter, according to various embodiments, an example of at least one flexible printed circuit board 300, as an example of an electrical connecting member included in the electronic device (e.g., the electronic device 200 of FIG. 2A), is described.

Figure 3A:
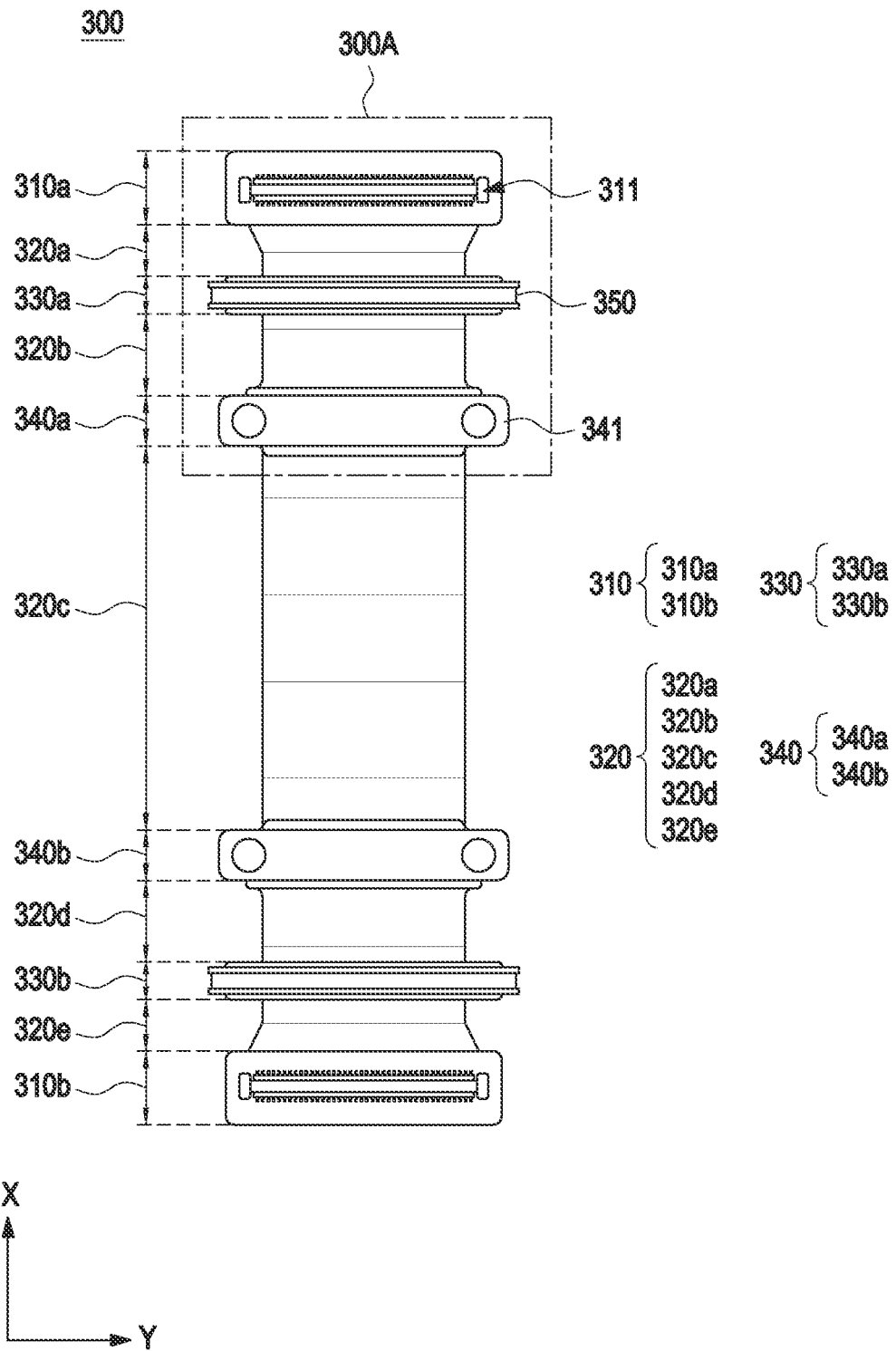
FIG. 3A is a view illustrating an example of at least one flexible printed circuit board according to an embodiment of the disclosure.
Figure 3B:
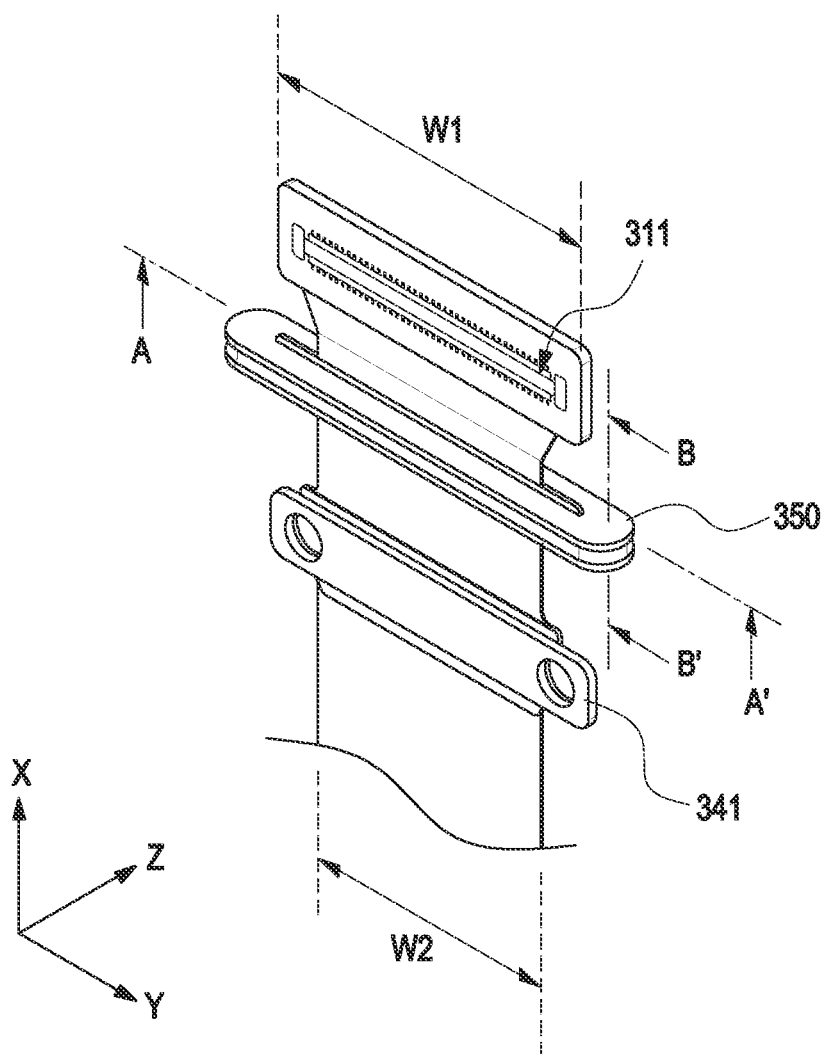
FIG. 3B is an enlarged view illustrating a specific portion of at least one flexible printed circuit board according to an embodiment of the disclosure.
Figure 3C:
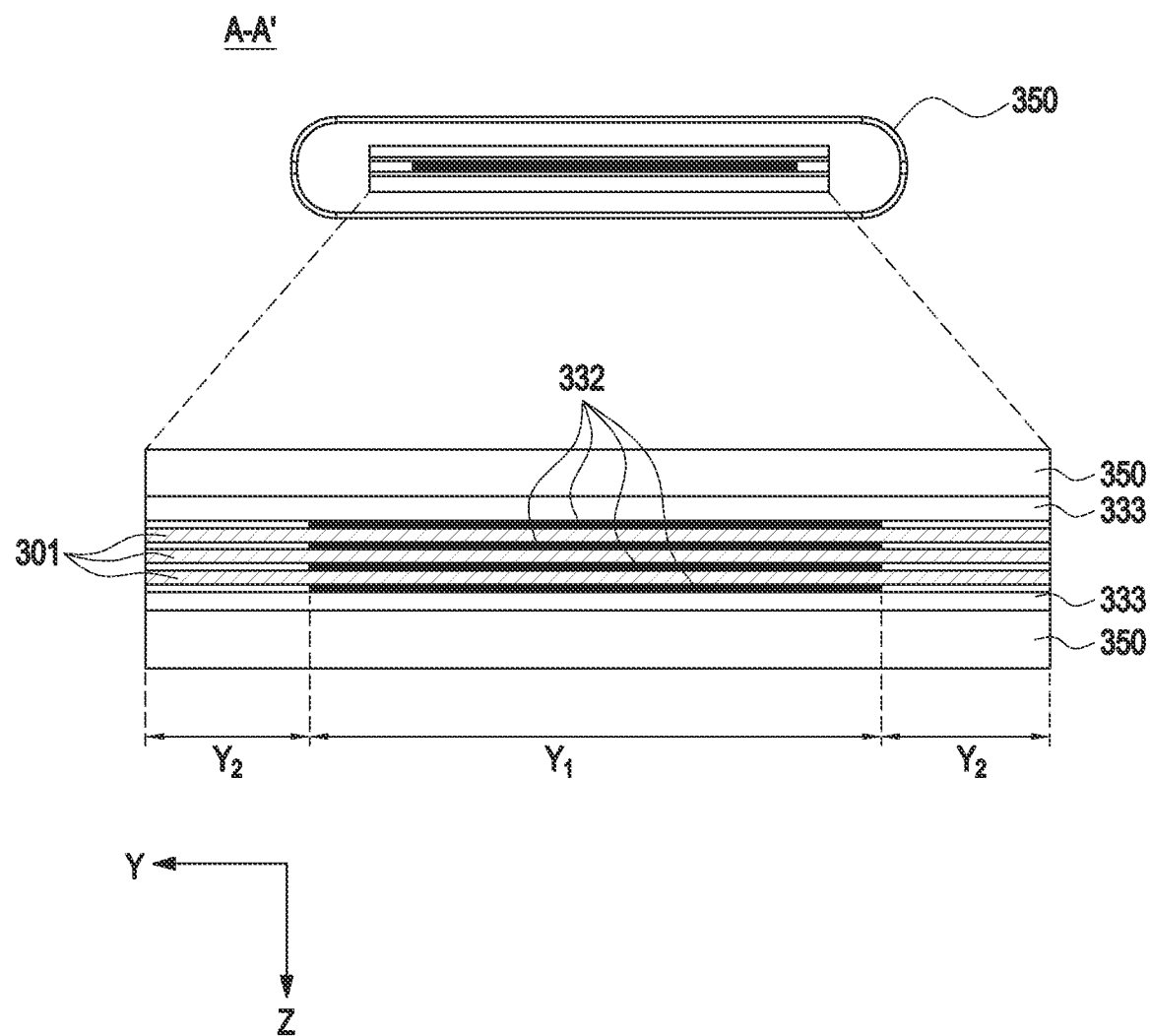
FIG. 3C is a view of a flexible printed circuit board cut along a Y-Z plane according to an embodiment of the disclosure.
Figure 3D:
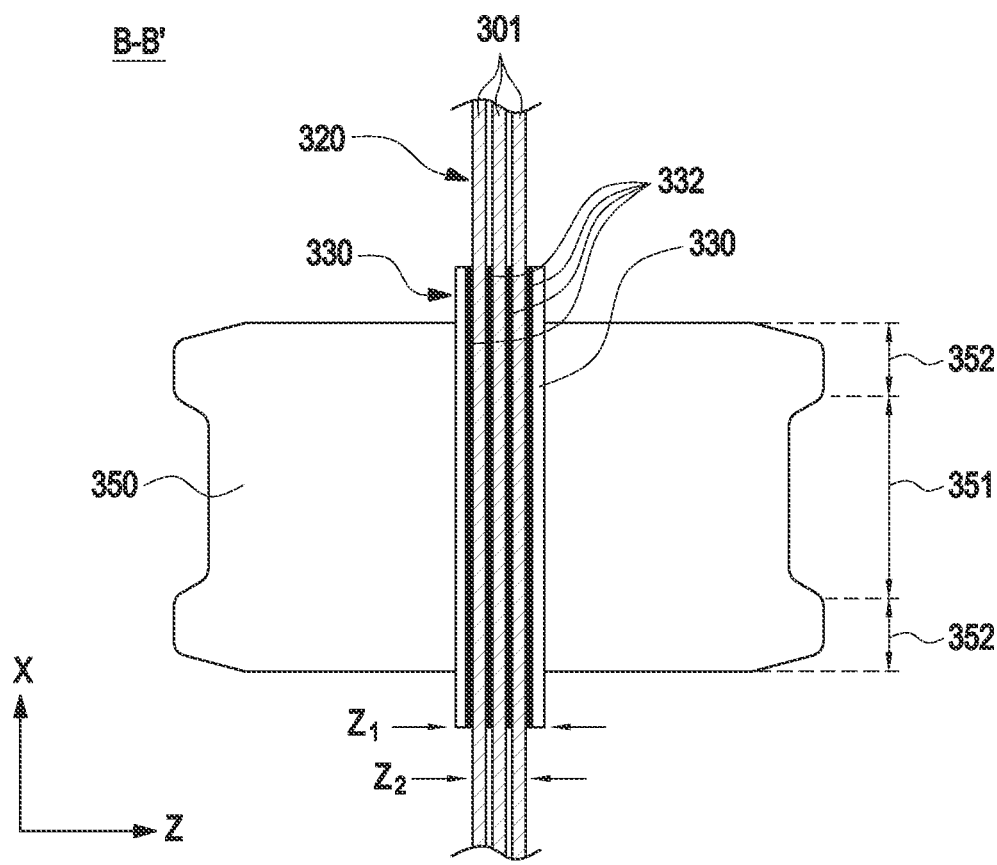
FIG. 3D is a view of a flexible printed circuit board cut along an X-Z plane according to an embodiment of the disclosure.
Figure 3E:
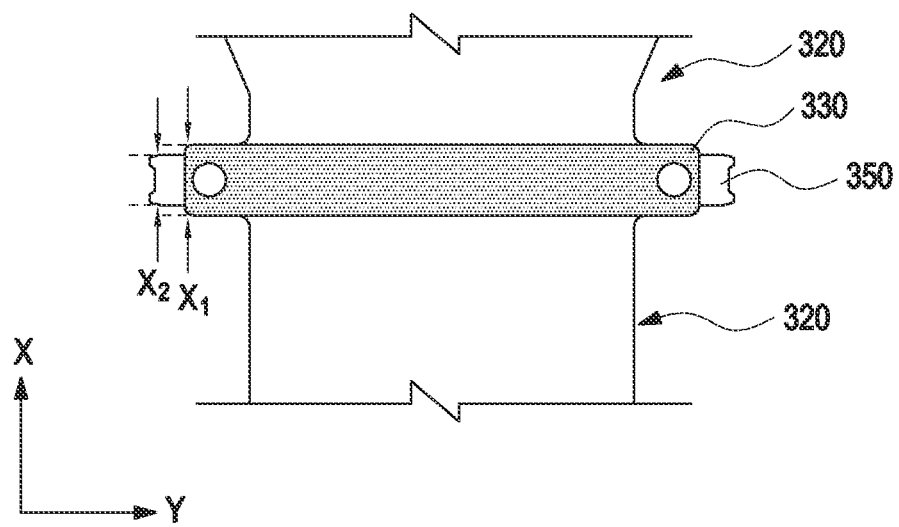
FIG. 3E is a view of a flexible printed circuit board cut along an X-Y plane according to an embodiment of the disclosure.
Figure 3F:
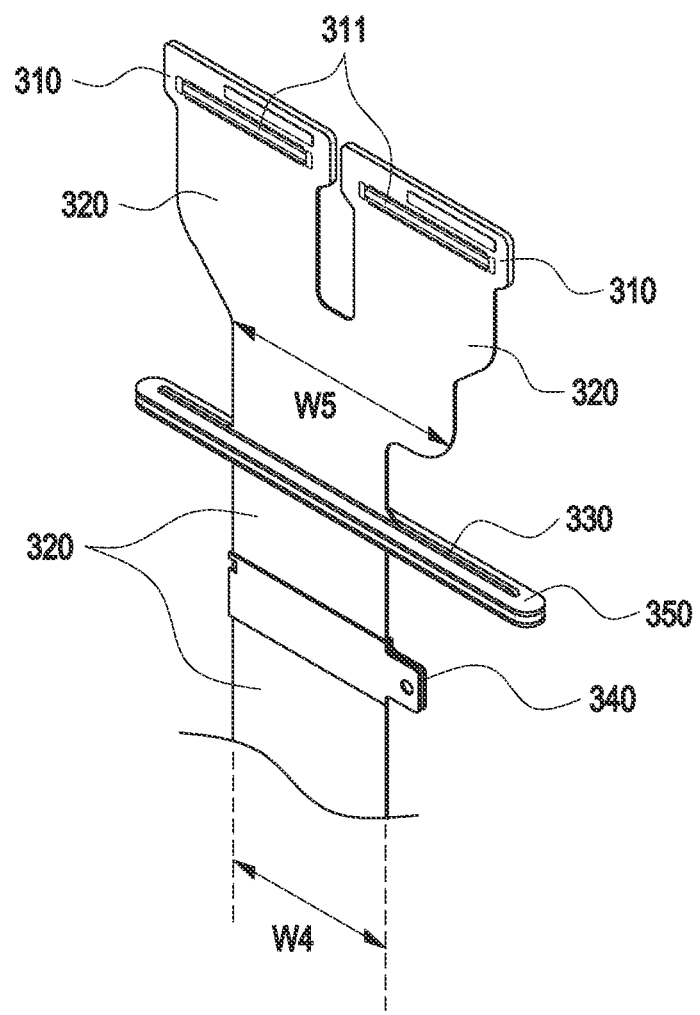
FIG. 3F is a view illustrating another example of a flexible printed circuit board according to an embodiment of the disclosure.

FIG. 3A is a view illustrating an example of at least one flexible printed circuit board 300 according to an embodiment of the disclosure. FIG. 3B is an enlarged view illustrating a specific portion 300A of at least one flexible printed circuit board 300 according to an embodiment of the disclosure. FIG. 3C is a view of a flexible printed circuit board 300 cut along a Y-Z plane (or a view of a specific portion 300A of the flexible printed circuit board 300 cut along line A-A') according to an embodiment of the disclosure. FIG. 3D is a view of a flexible printed circuit board 300 cut along an X-Z plane (or a view of a specific portion 300A of the flexible printed circuit board 300 cut along line B-B') according to an embodiment of the disclosure. FIG. 3E is a view of a flexible printed circuit board 300 cut along an X-Y plane according to an embodiment of the disclosure. FIG. 3F is a view illustrating another example of a flexible printed circuit board 300 according to an embodiment of the disclosure.

According to various embodiments, referring to FIGS. 3A to 3F, the flexible printed circuit board 300 may include a plurality of layers 301 and may include a connector portion 310 (i.e., 310a, and 310b), a wiring portion 320 (i.e., 320a, 320b, 320c, 320d, and 320e), a reinforcement portion 330 (i.e., 330a, and 330b), and a fixing portion 340 (i.e., 340a, and 340b). The connector portion 310, the wiring portion 320, the reinforcement portion 330, and the fixing portion 340 are only "names" for describing portions of the flexible printed circuit board 300 and, without limited to those described, the flexible printed circuit board 300 may be implemented to include various portions. That the flexible printed circuit board 300 is implemented with a plurality of layers 301 may mean that several same flexible printed circuit boards 300 overlap one another to form a plurality of layers 301. Alternatively, without being limited thereto, it may mean that a single flexible printed circuit board 300 is implemented to include a plurality of layers 301 (e.g., transmission layers described below). Although not specifically shown, one flexible printed circuit board 300 may include at least one transmission layer for transmission of signals and/or power, non-conductive layers which are stacked alternately with the at least one transmission layer, and a plurality of transmission lines (or conductive wires or conductive patterns, or conductive paths) (e.g., signal lines or power lines). some of the plurality of transmission lines (or conductive wires, conductive patterns, or conductive paths) may be formed on a specific transmission layer and be electrically connected to others of the plurality of transmission lines formed on another transmission layer through conductive vias formed in the non-conductive layer. The plurality of transmission lines may be arranged to be spaced apart from each other on the transmission layer. Meanwhile, when several flexible printed circuit boards 300 overlap, the flexible printed circuit boards 300 may be electrically connected to each other through via holes formed in the flexible printed circuit boards 300. For example, when two flexible printed circuit boards 300 overlap each other, a specific transmission line (or conductive wire, conductive pattern, or conductive path) of a flexible printed circuit board 300 disposed on a specific layer (e.g., a first layer) may be electrically connected to the transmission line of the flexible printed circuit board 300 on another layer (e.g., a second layer) through the via hole, so that the specific transmission line may jump and get around other transmission lines on the specific layer (e.g., the first layer). Alternatively, without limited to those described, only some of the overlapping flexible printed circuit boards 300 may be electrically connected or the flexible printed circuit boards 300 may be implemented to be electrically separated from each other. Hereinafter, examples of portions (e.g., the connector portion 310, the wiring portion 320, the fixing portion 340, and the reinforcement portion 330) of the flexible printed circuit board 300 are described.

An example of the connector portion 310 according to various embodiments is described below.

According to various embodiments, referring to FIGS. 3A and 3B, a connector portion 310 may be formed at an end portion forming each end (e.g., a first end and a second end) of the flexible printed circuit board 300. For example, the connector portion 310 may include a first connector portion 310a formed at the first end and a second connector portion 310b formed at the second end. The connector portion 310 may be implemented to include an electrical connecting structure. For example, the connector portion 310 may include a rigid portion formed at the end, and a pin 311 connected to an end of each of the transmission lines on at least one transmission layer may be disposed in the rigid portion, forming a predetermined connection end portion. The connection end portion may have a structure that includes a reinforcing material disposed between the plurality of pins 311 along with the plurality of pins 311 as shown in FIG. 3A. Further, without limited to those shown, each of the plurality of pins 311 may be in the form of a type of metal line and be disposed on the connector portion 310. Further, without limited to those described and/or shown, the connection end portion may have a structure, such as a type of receptacle or header. As the connection end portion of the connector portion 310 is coupled to a connector of an electric component (e.g., a printed circuit board) described below, the electric component and the flexible printed circuit board 300 may be electrically connected to each other (e.g., the transmission line on the transmission layer is connected to the electric component). Meanwhile, in the case of several overlapping flexible printed circuit boards 300, if the flexible printed circuit boards 300 are electrically connected to each other, the connector portion 310 may be formed in an end portion of a specific flexible printed circuit board 300 (e.g., the lowermost flexible printed circuit board 300), or if the flexible printed circuit boards 300 are electrically separated, a connector portion 310 implemented to include the pins 311 formed in the end portion of each flexible printed circuit board 300 may be formed.

According to various embodiments, the width in one direction (e.g., the Y-axis direction) of the connector portion 310 may be formed to be larger than the width of other portions (e.g., the wiring portion 320 and the reinforcement portion 330) of the flexible printed circuit board 300. For example, the width of the connector portion 310 may be formed to be larger than the width w2 of the wiring portion 320. As another example, the width of the connector portion 310 may be larger than the width w1 of the reinforcement portion 330. However, a first difference between the width s2 of the connector portion 310 and the width w1 of the reinforcement portion 330 may be smaller than a second difference between the width of the connector portion 310 and the width of the wiring portion 320. Without limited to those shown and/or described, the width of the connector portion 310 may be implemented to correspond (e.g., identical) to the width of the wiring portion 320 and/or the width of the reinforcement portion 330. According to other various embodiments, the width in one direction (e.g., in the Y-axis direction) of the connector portion 310 may be associated with the width in one direction of the through hole (e.g., the through hole 203 of FIG. 2B). The one direction may be a direction in which the width of the through hole (e.g., the through hole 203 of FIG. 2B) is longer. For example, when the end of the flexible printed circuit board 300, where the connector portion 310 is formed, is inserted into the waterproof area (e.g., the waterproof area 201 of FIG. 2B), the width of the through hole 203 may be required to be larger than the width of the connector portion 310. Accordingly, the width of the through hole 203 may be implemented to increase in proportion to the width of the connector portion 310. Alternatively, as opposed, the width of the connector portion 310 may be implemented in proportion to the width of the through hole 203. An example of the wiring portion 320 and the reinforcement portion 330 according to various embodiments is described below.

According to various embodiments, the wiring portion 320 may be portions 320a, 320b, 320c, 320d, and 320e between the portions (e.g., the connector portion 310, the reinforcement portion 330, and the fixing portion 340) of the flexible printed circuit board 300 (or portions connected between the portions). For example, the wiring portion 320 may be portions 320a and 320e connected to the connector portion 310 and the reinforcement portion 330. As another example, the wiring portion 320 may be portions 320b and 320d connected between the reinforcement portion 330 and the fixing portion 340. As another example, the wiring portion 320 may be the portion 320c connected between the reinforcement portions 330 (e.g., the first reinforcement portion 330 and the second reinforcement portion 330) of the flexible printed circuit board 300. As described above, the wiring portion 320 may be implemented of a flexible material and may include a plurality of layers 301 (e.g., several overlapping FPCBs or a plurality of layers 301 of a single FPCB). The wiring portion 320 may be bent with a predetermined curvature and, given the spatial arrangement, the wiring portion 320 may be disposed, in the bent state, in the electronic device (e.g., the electronic device 200 of FIG. 2A) (e.g., between the hinge structure and flexible display described below in connection with FIGS. 5A and 5B).

According to various embodiments, the reinforcement portion 330 may be formed at a portion of the flexible printed circuit board 300 which passes through the through hole (e.g., the through hole 203 of FIG. 2B) (or opening). For example, as described above, in a case where the flexible printed circuit board 300 is disposed in a plurality of areas (e.g., a waterproof area (e.g., the waterproof area 201 of FIG. 2B) and a non-waterproof area (e.g., the non-waterproof area 202 of FIG. 2B)) of the inner space of the electronic device (e.g., the electronic device 200 of FIG. 2A) through the through hole (e.g., the through hole 203 of FIG. 2B) of the housing 220 (or barrier) of the electronic device (e.g., the electronic device 200 of FIG. 2A), the reinforcement portion 330 may be a portion that passes through the through hole (e.g., the through hole 203 of FIG. 2B). The number of reinforcement portions 330 may be determined depending on the number of through holes 203 formed in the waterproof area (e.g., the waterproof area 201 of FIG. 2B) implemented in the electronic device 200 and be formed. For example, the flexible printed circuit board 300 may include reinforcement portions 330a and 330b passing through two through holes. Referring to FIGS. 3A and 3B, a waterproofing member 350 may be disposed to surround the reinforcement portion 330 to reduce entry of fluid into the waterproof area (e.g., the waterproof area 201 of FIG. 2B). The reinforcement portion 330 may be manufactured in a special manner as compared with the other portions (e.g., the wiring portion 320) to reduce deformation (e.g., twist and/or bending) of the waterproofing member 350 and reduce damage to the plurality of layers 301 of the reinforcement portion 330 of the flexible printed circuit board 300 and/or the portion (e.g., a portion of the wiring portion 320) connected to the reinforcement portion 330. For example, when the waterproofing member 350 is inserted into the through hole (e.g., the through hole 203 of FIG. 2B) and assembled, the waterproofing member 350 may be twisted or bent by external force, causing assembly difficult. As another example, as the waterproofing member 350 disposed in the gap between the through hole (e.g., the through hole 203 of FIG. 2B) and the flexible printed circuit board 300 sags or bends, the plurality of layers of the portion (e.g., the reinforcement portion 330) of the flexible printed circuit board 300 where the reinforcement portion 330 is provided and/or the portion (e.g., a portion of the wiring portion 320) connected to the reinforcement portion 330 may be peeled to leave a gap, and fluid may be introduced through the gap into the waterproof area (e.g., the waterproof area 201 of FIG. 2B). As another example, if the flexible printed circuit board 300 is bent after the waterproofing member 350 is assembled into the through hole (e.g., the through hole 203 of FIG. 2B), some of the plurality of layers 301 may be bent due to a difference in curvature between the plurality of layers 301 of the flexible printed circuit board 300, and the fluid may flow through the bent gap into the waterproof area (e.g., the waterproof area 201 of FIG. 2B). Thus, the reinforcement portion 330 may provide rigidity to reduce deformation of the waterproofing member 350 and damage (e.g., bending) to the plurality of layers 301, thereby enhancing waterproofness of the waterproof area (e.g., the waterproof area 201 of FIG. 2B). The above-described examples of the waterproofing member 350 and the reinforcement portion 330 are further described below.

An example of the waterproofing member 350 according to various embodiments is described.

According to various embodiments, referring to FIGS. 3A and 3D, the waterproofing member 350 may include a body portion 351 formed with a through hole (e.g., the through hole 203 of FIG. 2B) through which a portion (e.g., the reinforcement portion 330) of the flexible printed circuit board 300 passes and coupling portions 352 connected to the body portion 351. The portions (e.g., the body portion 351 and the coupling portion 352) may be integrally configured or be configured to be assemblable. Meanwhile, without limited to those shown, the waterproofing member 350 may be implemented to include more or less components. For example, without limited to those shown, the waterproofing member 350 may be implemented to include a body portion 351 and a single coupling portion connected with the body portion 351. As shown in FIGS. 3A and 3C, the body portion 351 may be implemented in an oval shape whose vertical axis is relatively longer than the horizontal axis. Or, without limited to those described and/or shown, the waterproofing member 350 may be prepared in a rectangular shape in which case the edges of the waterproofing member 350 may be rounded. When viewed from above the body portion 351 (e.g., when observed in the −x-axis direction), the area of the body portion 351 may be implemented to correspond the area of the through hole (e.g., the through hole 203 of FIG. 2B) of the housing. For example, referring to FIG. 3C, the width (or thickness) (e.g., the length in the Y-axis direction) of the body portion 351 may be implemented to correspond to the width (e.g., the length in the Y-axis direction) of the through hole (e.g., the through hole 203 of FIG. 2B) of the housing. As another example, referring to FIG. 3D, the length in another direction (e.g., the length in the Z-axis direction) of the body portion 351 may be implemented to correspond to the length in another direction (e.g., the length in the Z-axis direction) of the through hole (e.g., the through hole 203 of FIG. 2B) of the housing. Referring to FIG. 3D, the height (e.g., the length in the X-axis direction) of the body portion 351 may be implemented to correspond to the depth (or the thickness of the housing) of the through hole (e.g., the through hole 203 of FIG. 2B) (or opening) of the housing but, without limited to those described, it may be implemented to be smaller or larger than the depth of the through hole (e.g., the through hole 203 of FIG. 2B). Referring to FIG. 3C, the area (e.g., the lengths in the Y-axis and Z-axis directions) of the through hole (e.g., the through hole 203 of FIG. 2B) formed in the body portion 351 may be implemented to correspond to the area (e.g., the lengths in the Y-axis and Z-axis directions) of the reinforcement portion 330 so that the reinforcement portion 330 may be inserted into the through hole of the body portion 351. When the reinforcement portion 330 is inserted, the outer surface of the reinforcement portion 330 may contact the inner surface of the through hole (e.g., the through hole 203 of FIG. 2B), reducing the inflow of the fluid. Referring to FIG. 3D, as the coupling portions 352 are implemented to have a predetermined step C from the body portion 351, the waterproofing member 350, when inserted into the through hole (e.g., the through hole 203 of FIG. 2B) of the housing, may be tightly coupled by the contact between the side surfaces of the coupling portions 352 and the inner surface of the through hole (e.g., the through hole 203 of FIG. 2B). Recesses into which the coupling portions 352 may be fitted may be formed in the inner surface of the through hole 203, and the coupling portions 352 may be fitted into the recesses. The coupling portions 352 may also be implemented in a shape (e.g., oval or rectangular) corresponding to the body portion 351. However, as described above, the area of the coupling portion 352 may be implemented to be larger than the area of the body portion 351 to have the step c. For example, referring to FIGS. 3A and 3D, the length in one direction (e.g., the length in the Z-axis direction) may be implemented to be relatively larger by the step c than the length of the body portion 351. Accordingly, portions (e.g., the coupling portions 352) of the waterproofing member 350, which are a predetermined area broader than the through hole (e.g., the through hole 203 of FIG. 2B), are fitted into the through hole (e.g., the through hole 203 of FIG. 2B), so that the waterproofing member 350 may be more tightly coupled into the through hole (e.g., the through hole 203 of FIG. 2B).

According to various embodiments, the waterproofing member 350 may include a through hole into which the reinforcement portion 330 may be fitted. As shown, the waterproofing member 350 may include a single through hole or may include a plurality of through holes. For example, when a plurality of flexible printed circuit boards 300 are arranged, the waterproofing member 350 may include a plurality of through holes through which the plurality of flexible printed circuit boards 300 may be disposed. However, without limited to those described, in a case where a plurality of flexible printed circuit boards 300 are arranged, a single reinforcement portion 330, connecting the plurality of flexible printed circuit boards 300 together, may be formed, and the single reinforcement portion 330 may be fitted into the single hole of the waterproofing member 350, and the plurality of flexible printed circuit boards 330 may be arranged.

According to various embodiments, the lateral thickness of the waterproofing member 350 (e.g., the thickness in the Y-axis direction) may be implemented to be equal to or smaller (or relatively smaller) than the vertical thickness (e.g., the thickness in the Z-axis direction). The lateral thickness may be determined based on the length in the Y-axis direction of the through hole (e.g., the through hole 203 of FIG. 2B) formed in the housing and the length in the Y-axis direction of the reinforcement portion 330. As the lateral thickness is implemented to be equal to or smaller than the vertical thickness, assembly of the flexible printed circuit board 300 may be easier, and deformation (e.g., bending) of the flexible printed circuit board 300 due to assembly may be prevented.

According to various embodiments, the waterproofing member 350 may be implemented of an elastic material (e.g., at least one, or a combination, of rubber, flexible plastic, dispensing, bonding, or polymer). Accordingly, the waterproofing member 350 may be inserted and fixed into the through hole 203, and the gap (or opening) between the through hole 203 and the reinforcement portion 330 may be filled with the waterproofing member 350 (or the opening may be closed).

An example of the reinforcement portion 330 according to various embodiments is described below.

According to various embodiments, referring to FIGS. 3A and 3B, the reinforcing portion 330 may be implemented to have a larger width w1 than the width w2 of the wiring portion 320 (e.g., the length in the Y-axis direction) of another flexible printed circuit board. For example, referring to FIG. 3C, the reinforcement portion 330 may include a first area Y1, where the above-described, at least one, transmission line (or conductive wire, conductive pattern, or conductive paths) is disposed, and a second area Y2 which is a dummy area. The second area Y2 may be implemented of a polyimide (PI)-based material or may be implemented of a material, such as an adhesive layer. The second area Y2 may be an area, in which at least one transmission line (or conductive wire, conductive pattern, or conductive paths) is not disposed unlike the first area Y1. The second area Y2 is not implemented in the wiring portion 320, so that the reinforcement portion 330 may have a width w1 larger than the width w2 of the wiring portion 320 by the width of the second area Y2.

According to various embodiments, the reinforcement portion 330 may include bonding members 332 (or adhesive members) between the plurality of layers 301. Referring to FIG. 3C, the bonding members 332 may be implemented as predetermined layers disposed between the plurality of layers 301 and may be implemented of various types of polymers capable of reducing separation (or detachment) between the layers due to external shocks. For example, the bonding member 332 may include a tape implemented as a predetermined adhesive material (e.g., a high-modulus substance, such as epoxy). Further, without limited to those described, the bonding members 332 may include a bonding material that fills the gaps between the plurality of layers 301 while forming predetermined layers. As is described below, the bonding members 332 may be formed between the plurality of layers 301 by a thermocompression process. The reinforcement portion 330, including the bonding members 332 between the plurality of layers 301, may be rendered to have higher rigidity than the other portions (e.g., the wiring portion 320) by the thermocompression (or may be rigidly implemented). The above-described dummy area (e.g., the second area Y2) may be formed by the thermocompression. Further, the reinforcement portion 330 may further include rigid layers 333 on the uppermost layer and under the lowermost layer of the plurality of layers 301. As the bonding member 33 may be disposed between the rigid layer 333 and the uppermost or lowermost layer of the plurality of layers 301, the rigid layer 333 and the uppermost or lowermost layer of the plurality of layers 301 may be attached to each other. Thus, referring to FIG. 3D, the thickness of the reinforcement portion 330 (e.g., the length in the Z-axis direction) Z1 may be formed to be larger than the thickness Z2 of the wiring portion 320. Since no bonding member 332 is formed in the plurality of layers 301 of the wiring portion 320, a gap may be formed between the plurality of layers 301 of the wiring portion 320 adjacent to the reinforcement portion 330. Accordingly, the length X1 in the length direction of the flexible printed circuit board 300 of the reinforcement portion 330 (e.g., the length in the X-axis direction) may be implemented to be larger than the length X2 of the waterproofing member 350 (e.g., the length in the X-axis direction) so that the gap is formed outside the waterproofing member 350.

According to various embodiments, a predetermined reinforcing member may further be disposed on the reinforcement portion 330. For example, the reinforcing member may include a metal member, such as a metal, for providing rigidity to the reinforcement portion 330. To enhance adhesivity of the waterproofing member 350 to the reinforcement portion 330 and the reinforcing member, a predetermined structure (e.g., a hole structure or an undercut structure) may be formed in the reinforcement portion 330 and the reinforcing member. The reinforcing members and structures (e.g., hole structures or undercut structures) are described below in further detail with reference to FIG. 9C.

According to various embodiments, referring to FIG. 3E, to more firmly support the waterproofing member 350, the length x1 in the length direction of the flexible printed circuit board 300 of the reinforcement portion 330 (e.g., the length in the X-axis direction) may be implemented to be larger than the length x2 of the waterproofing member 350 (e.g., the length in the X-axis direction).

According to various embodiments, referring to FIG. 3E, the portion 321 where the reinforcement portion 330 and the wiring portion 320 are connected may be formed with a predetermined curvature. As described above, since the width of the reinforcement portion 330 (e.g., the length in the Y-axis direction) is implemented to be larger than the width of the wiring portion 320 320, the portion 321 where the predetermined wiring portion 320 is connected to the reinforcement portion 330 may be implemented to have a predetermined curvature inward so as to gradually reduce the difference in width between the reinforcement portion 330 and the wiring portion 320. Accordingly, the portion 321 where the wiring portion 320 is connected to the reinforcement portion 330 may be implemented so that its width (e.g., the length in the Y-axis direction) gradually increases as it approaches the reinforcement portion 330.

An example of the fixing portion 340 according to various embodiments is described below.

According to various embodiments, the fixing portion 340 may be formed in a portion of the flexible printed circuit board 300 (e.g., a partial area of the wiring portion 320) disposed on at least a portion of the structure disposed inside the electronic device (e.g., the electronic device 200 of FIG. 2A). For example, when the flexible printed circuit board 300 is disposed inside the electronic device (e.g., the electronic device 200 of FIG. 2A), the portion disposed on the housing may be a portion where the fixing portion 340 is formed. The fixing portion 340 may be a portion implemented to be stably fixed (or coupled) to the housing in a state of facing a partial surface of the hinge structure of the foldable electronic device (e.g., the electronic device 200 of FIG. 2A) described below. In an embodiment, the fixing portion 340 may be rigidly implemented. Referring to FIGS. 3A and 3B, a fixing member 341 including a through hole (e.g., the through hole 203 of FIG. 2B) or an undercut structure may be disposed in at least a partial area of the rigidly implemented fixing portion 340 and may be coupled to the housing based on the through hole or undercut structure. In another embodiment, without limited to those described or shown, the fixing portion 340 may be attached to the housing by a tape while being disposed in the housing.

Meanwhile, without limited to those described and/or shown, the flexible printed circuit board 300 may be implemented in various shapes. For example, at least two or more connector portions 310, at least two or more wiring portions 320, and/or at least two or more reinforcement portions 330 may be included in a portion of the flexible printed circuit board 300. For example, referring to FIG. 3E, there may be included two connector portions 310 of the flexible printed circuit board 300, wiring portions 320 each extending from a corresponding to one of the two connector portions 310, and the reinforcement portion 330 connected to the wiring portions 320, passing through the through hole (e.g., the through hole 203 of FIG. 2B) of the housing, and surrounded by the waterproofing member 350, and the fixing portion 340. The length in one direction (e.g., the Y-axis direction) of the connector portions 310 and the length in one direction (e.g., the Y-axis direction) of the through hole (e.g., the through hole 203 of FIG. 2B) (or the length in the longitudinal direction) may be implemented to correspond to each other. The length in one direction (e.g., the Y-axis direction) of the reinforcement portion 330 may be formed to correspond to the length in one direction (e.g., the Y-axis direction) of the through hole (e.g., the through hole 203 of FIG. 2B) (or the length in the longitudinal direction). The length in one direction (e.g., the Y-axis direction) of the reinforcement portion 330 may be implemented to be larger than the length W5 in one direction (e.g., the Y-axis direction) of the wiring portion 320 between the coupling portions 310 and the reinforcement portion 330 and the length W4 in one direction (e.g., the Y-axis direction) of the wiring portion 320 between the reinforcement portion 330 and the fixing portion 340. The foregoing description may be applied to the connector portion 310, the wiring portion 320, the reinforcement portion 330, and the fixing portion 340, and no duplicate description is given. In the description of the flexible printed circuit board 300 included in the foldable electronic device 400 or 600 described below in connection with FIGS. 6A to 6C and FIGS. 7A to 7C, an example of the flexible printed circuit board 300 including the above-described plurality of connector portions is further described.

Described below is an example of an electronic device including a plurality of areas (e.g., a waterproof area (e.g., the waterproof area 201 of FIG. 2B) and a non-waterproof area (e.g., the non-waterproof area 202 of FIG. 2B)) and a flexible printed circuit board 300 disposed between the plurality of areas according to various embodiments. Since the description made above in connection with FIGS. 1, 2A, 2B, and 3A to 3F may be applied to the following descriptions, no duplicate description is given.

Figure 4A:
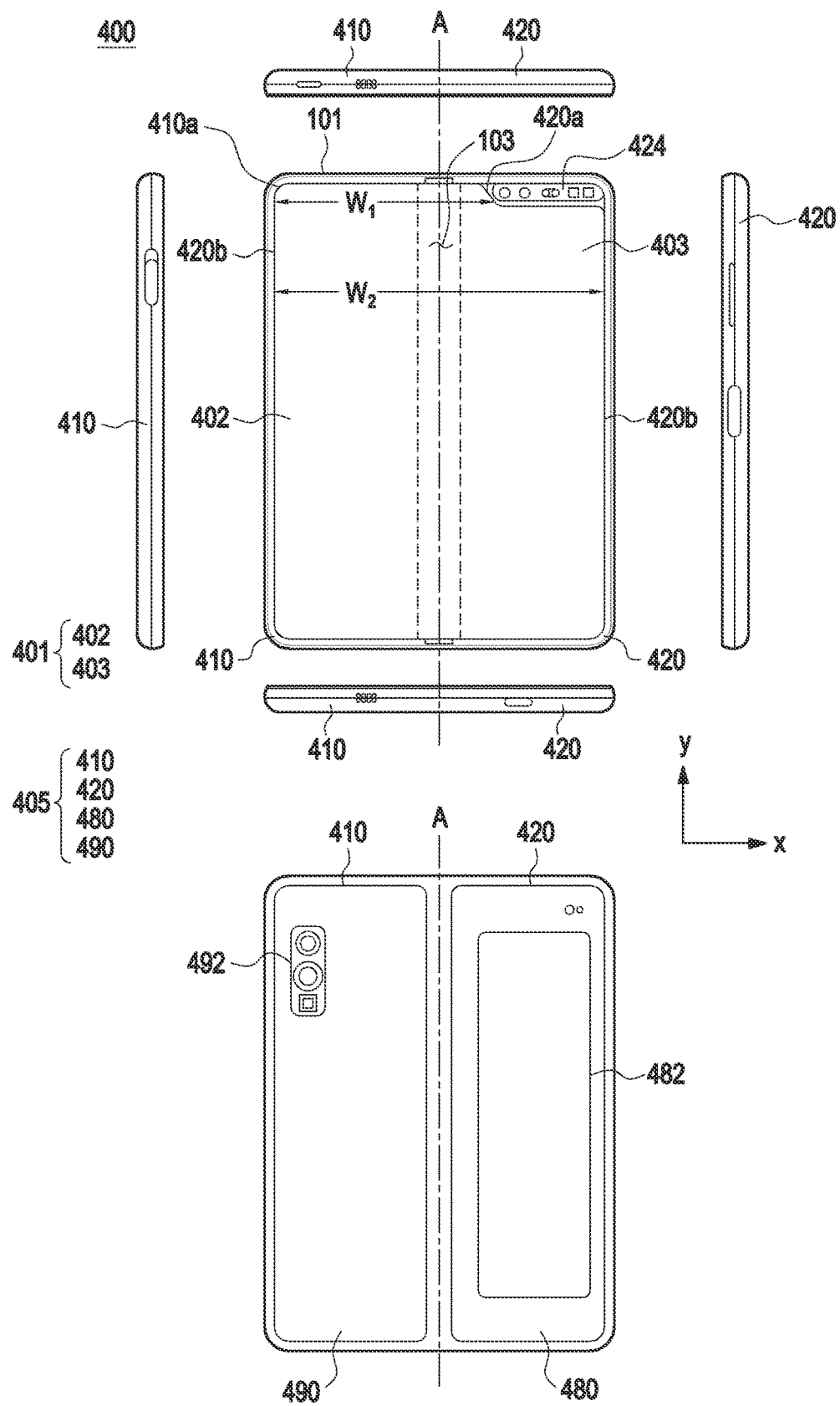
FIG. 4A is a view illustrating an unfolded state of an electronic device according to an embodiment of the disclosure.
Figure 4B:
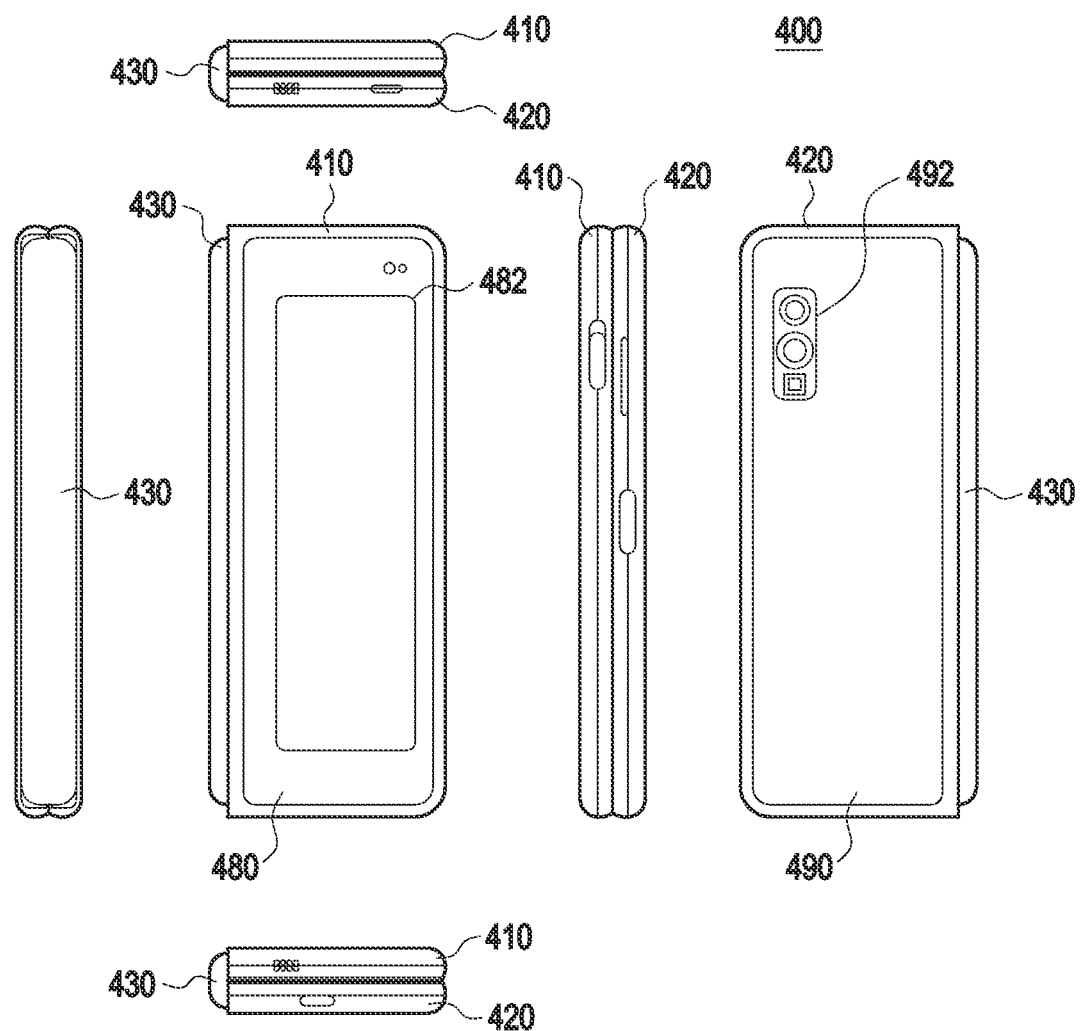
FIG. 4B is a view illustrating a folded state of an electronic device according to an embodiment of the disclosure.

FIG. 4A is a view illustrating an unfolded state of an electronic device according to an embodiment of the disclosure. FIG. 4B is a view illustrating a folded state of an electronic device according to an embodiment of the disclosure.

Referring to FIGS. 4A and 4B, according to an embodiment, an electronic device 400 may include a foldable housing 405, a hinge cover 430 covering a foldable portion of the foldable housing, and a flexible or foldable display 401 (hereinafter, simply "display 401") disposed in a space formed by the foldable housing 405. In the disclosure, a surface where the display 401 is disposed is defined as a first surface or a front surface of the electronic device 400. The opposite surface of the front surface is defined as a second surface or a rear surface of the electronic device 400. The surface surrounding the space between the front and rear surfaces is defined as a third surface or a side surface of the electronic device 400.

In an embodiment, the foldable housing 405 may include a first housing structure 410, a second housing structure 420 including a sensor area 424, a first rear cover 480, a second rear cover 490, a hinge cover 430 (e.g., a first hinge cover 431 and a second hinge cover 432), and brackets (e.g., a first bracket 411 and a second bracket 412) described below in connection with FIG. 3C. The foldable housing 405 of the electronic device 400 are not limited to the shape and coupling shown but may rather be implemented in other shapes or via a combination and/or coupling of other components. For example, the first housing structure 410, the first rear cover 480, the first hinge cover 431, and the first bracket 411 may be integrally formed or assembled, and the second housing structure 420, the second rear cover 490, the second hinge cover 432, and the second bracket 412 may be integrally formed or assembled. As is described below, inner spaces (e.g., waterproof areas 201) may be formed between the housing structures (e.g., the first housing structure 410 and the second housing structure 420), the rear covers (e.g., the first rear cover 480 and the second rear cover 490), and the brackets (e.g., the first bracket 411 and the second bracket 412), and at least one electric component (e.g., the printed circuit boards 530a and 530b of FIG. 5B) may be disposed in the inner spaces. Further, an inner space (e.g., the non-waterproof area 202), separated from the above-described waterproof area 201, may also be formed between the flexible display 401 (or a plate on which the flexible display 401 is disposed) and at least part of the housing structures (e.g., the first housing structure 410 and the second housing structure 420) (e.g., at least part of brackets (e.g., the first bracket 411 and the second bracket 412) coupled to the housing structures (e.g., the first housing structure 410 and the second housing structure 420)). Through holes 510 and 520 may be formed in at least part of the housing structures (e.g., the first housing structure 410 and the second housing structure 420) (or at least part of the brackets (e.g., the first bracket 411 and the second bracket 412)) coupled to the housing structures (e.g., the first housing structure 410 and the second housing structure 420)), and the flexible printed circuit board (the flexible printed circuit board 330 described above in connection with FIG. 3A) may be disposed through the through holes 510 and 520. Accordingly, the flexible printed circuit board (the flexible printed circuit board 330 described above in connection with FIG. 3A) may be disposed in at least part of the housing structures (e.g., the first housing structure 410 and the second housing structure 420). An example in which the flexible printed circuit board (the flexible printed circuit board described above in connection with FIG. 3A) is disposed is described below with reference to FIGS. 4A and 4B.

In the illustrated embodiment, the first housing structure 410 and the second housing structure 420 may be positioned on opposite sides of a folding axis (axis A), and they may be overall symmetrical in shape with each other with respect to the folding axis A. As set forth below, the first housing structure 410 and the second housing structure 420 may have different angles or distances formed therebetween depending on whether the electronic device 400 is in an unfolded, folded, or intermediate state. In the illustrated embodiment, the first housing structure 410 and the second housing structure 420 may be symmetrical in shape except that the second housing structure 520 further includes the sensor area 424 where various sensors are arranged, unlike the first housing structure 510.

According to an embodiment, as shown in FIG. 3A, the first housing structure 410 and the second housing structure 420 together may form a recess to receive the display 401. In the illustrated embodiment, due to the sensor area 424, the recess may have two or more different widths in the direction perpendicular to the folding axis A.

For example, the recess may have a first width w1 between a first portion 410a, parallel with the folding axis A, of the first housing structure 410, and a first portion 420a, formed at an edge of the sensor area 424, of the second housing structure 420 and a second width w2 formed by a second portion 410b of the first housing structure 410 and a second portion 420b, which is parallel with the folding axis A and does not correspond to the sensor area 424, of the second housing structure 420. The second width w2 may be longer than the first width w1. In other words, the first portion 410a of the first housing structure 410 and the first portion 420a of the second housing structure 420, which are asymmetrical in shape to each other, may form the first width w1 of the recess, and the second portion 410b of the first housing structure 410 and the second portion 420b of the second housing structure 420, which are symmetrical in shape to each other, may form the second width w2 of the recess. In an embodiment, the first portion 420a and second portion 420b of the second housing structure 420 may have different distances from the folding axis A. The width of the recess is not limited thereto. According to various embodiments, the recess may have a plurality of widths due to the shape of the sensor area 424 or the asymmetric portions of the first housing structure 410 and the second housing structure 420.

In an embodiment, the first housing structure 410 and the second housing structure 420 may at least partially be formed of a metal or non-metallic material with a rigidity selected to support the display 401.

In an embodiment, the sensor area 424 may be formed adjacent to a corner of the second housing structure 420 and to have a predetermined area. However, the placement, shape, or size of the sensor area 424 is not limited to those illustrated. For example, in another embodiment, the sensor area 424 may be provided in a different corner of the second housing structure 420 or in any area between the top corner and the bottom corner. In an embodiment, components for performing various functions, embedded in the electronic device 400, may be visually exposed through the sensor area 424 or one or more openings in the sensor area 424 to the front surface of the electronic device 400. In various embodiments, the components may include various kinds of sensors. The sensor may include at least one of, e.g., a front-facing camera, a receiver, or a proximity sensor.

The first rear cover 480 may be disposed on one side of the folding axis on the rear surface of the electronic device and have a substantially rectangular periphery which may be surrounded by the first housing structure 410. Similarly, the second rear cover 490 may be disposed on the opposite side of the folding axis on the rear surface of the electronic device and its periphery may be surrounded by the second housing structure 420.

In the illustrated embodiment, the first rear cover 480 and the second rear cover 490 may be substantially symmetrical in shape with respect to the folding axis (axis A). However, the first rear cover 480 and the second rear cover 490 are not necessarily symmetrical in shape. In another embodiment, the electronic device 400 may include the first rear cover 480 and the second rear cover 490 in various shapes. In another embodiment, the first rear cover 480 may be integrally formed with the first housing structure 410, and the second rear cover 490 may be integrally formed with the second housing structure 420.

In an embodiment, a combined structure of the first rear cover 480, the second rear cover 490, the first housing structure 410, and the second housing structure 420 may form a space where various components (e.g., a printed circuit board or battery) of the electronic device 400 may be disposed. According to an embodiment, one or more components may be arranged or visually exposed on/through the rear surface of the electronic device 400. For example, at least a portion of a sub display 383 may be visually exposed through a first rear surface area 482 of the first rear cover 480. In another embodiment, one or more components or sensors may be visually exposed through a second rear surface area 492 of the second rear cover 490. According to various embodiments, the sensor may include a proximity sensor and/or a rear-facing camera.

Referring to FIG. 4B, the hinge cover 430 may be disposed between the first housing structure 410 and the second housing structure 420 to hide the internal components (e.g., the hinge structure). For example, the hinge cover 431 may include a first hinge cover 431 integrally formed or assembled with the first housing structure 410 and a second hinge cover 432 integrally formed or assembled with the second housing structure 420. According to an embodiment, the hinge cover 430 may be hidden by a portion of the first housing structure 410 and second housing structure 420 or be exposed to the outside depending on the state (e.g., the unfolded state or folded state) of the electronic device 400.

For example, as shown in FIG. 4A, in the unfolded state of the electronic device 400, the hinge cover 430 may be hidden, and thus not exposed, by the first housing structure 410 and the second housing structure 420. By way of example, as shown in FIG. 4B, in the folded state (e.g., the fully folded state) of the electronic device 400, the hinge cover 430 may be exposed to the outside between the first housing structure 410 and the second housing structure 420. As an example, in an intermediate state in which the first housing structure 410 and the second housing structure 420 are folded with a certain angle, the first hinge cover 430 may be partially exposed to the outside between the first housing structure 410 and the second housing structure 420. However, the exposed area may be smaller than in the fully folded state. According to an embodiment, the hinge cover 430 may include a curved surface.

The display 401 may be disposed on a space formed by the foldable housing 405. For example, the display 401 may be seated on a recess formed by the foldable housing 405 and may occupy most of the front surface of the electronic device 400.

Thus, the front surface of the electronic device 400 may include the display 401 and a partial area of the first housing structure 410 and a partial area of the second housing structure 420, which are adjacent to the display 401. The rear surface of the electronic device 400 may include the first rear cover 480, a partial area of the first housing structure 410, which is adjacent to the first rear cover 480, the second rear cover 490, and a partial area of the second housing structure 420, which is adjacent to the second rear cover 490.

The display 401 may mean a display at least a portion of which may be transformed to be flat or curved. According to an embodiment, the display 401 may include a folding area 404404, a first area 402 disposed on one side of the folding area 404404 (e.g., the left side of the folding area 404404 of FIG. 4A), and a second area 403 disposed on the opposite side of the folding area 404404 (e.g., the right side of the folding area 103 of FIG. 4A).

The segmentation of the display 401 as shown in FIG. 4A is merely an example, and the display 401 may be divided into a plurality of (e.g., four or more, or two) areas depending on the structure or function of the display 401. As an example, in the embodiment illustrated in FIG. 4A, the area of the display 401 may be segmented by the folding area 404404 or folding axis (axis A) extending in parallel with the y axis but, in another embodiment, the display 401 may also be segmented with respect to other folding area (e.g., a folding area parallel with the x axis) or other folding axis (e.g., a folding axis parallel with the x axis).

The first area 402 and the second area 403 may be overall symmetrical in shape with respect to the folding area 404404. However, unlike the first area 402, the second area 403 may include a notch depending on the presence of the sensor area 424, but the rest may be symmetrical in shape with the first area 402. In other words, the first area 402 and the second area 403 may include symmetrical portions and asymmetrical portions.

Described below are the operation of the first housing structure 410 and the second housing structure 420 and each area of the display 401 depending on the state (e.g., the unfolded state (flat state) and folded state) of the electronic device 400.

According to an embodiment, when the electronic device 400 is in the unfolded state (flat state) (e.g., FIG. 4A), the first housing structure 410 and the second housing structure 420 may be angled at 180 degrees therebetween, facing in the same direction. The surface of the first area 402 and the surface of the second area 403 of the display 401 may be angled at 180 degrees therebetween while facing in the same direction (e.g., forward of the front surface of the electronic device). The folding area 404404 may be coplanar with the first area 402 and the second area 403.

According to an embodiment, when the electronic device 400 is in the folded state (e.g., FIG. 4B), the first housing structure 410 and the second housing structure 420 may be disposed to face each other. The surface of the first area 402 and the surface of the second area 403 of the display 401 may be angled at a small angle (e.g., ranging from 0 degrees to 10 degrees) therebetween while facing each other. At least a portion of the folding area 404404 may have a curved surface with a predetermined curvature.

According to an embodiment, when the electronic device 400 is in the intermediate state (folded state) (e.g., FIG. 4B), the first housing structure 410 and the second housing structure 420 may be disposed at a certain angle therebetween. The surface of the first area 402 of the display 401 and the surface of the second area 403 may form an angle which is larger than the angle in the folded state and smaller than the angle in the unfolded state. The folding area 404404 may at least partially have a curved surface with a predetermined curvature and, the curvature may be smaller than that when it is in the folded state.

Figure 4C:
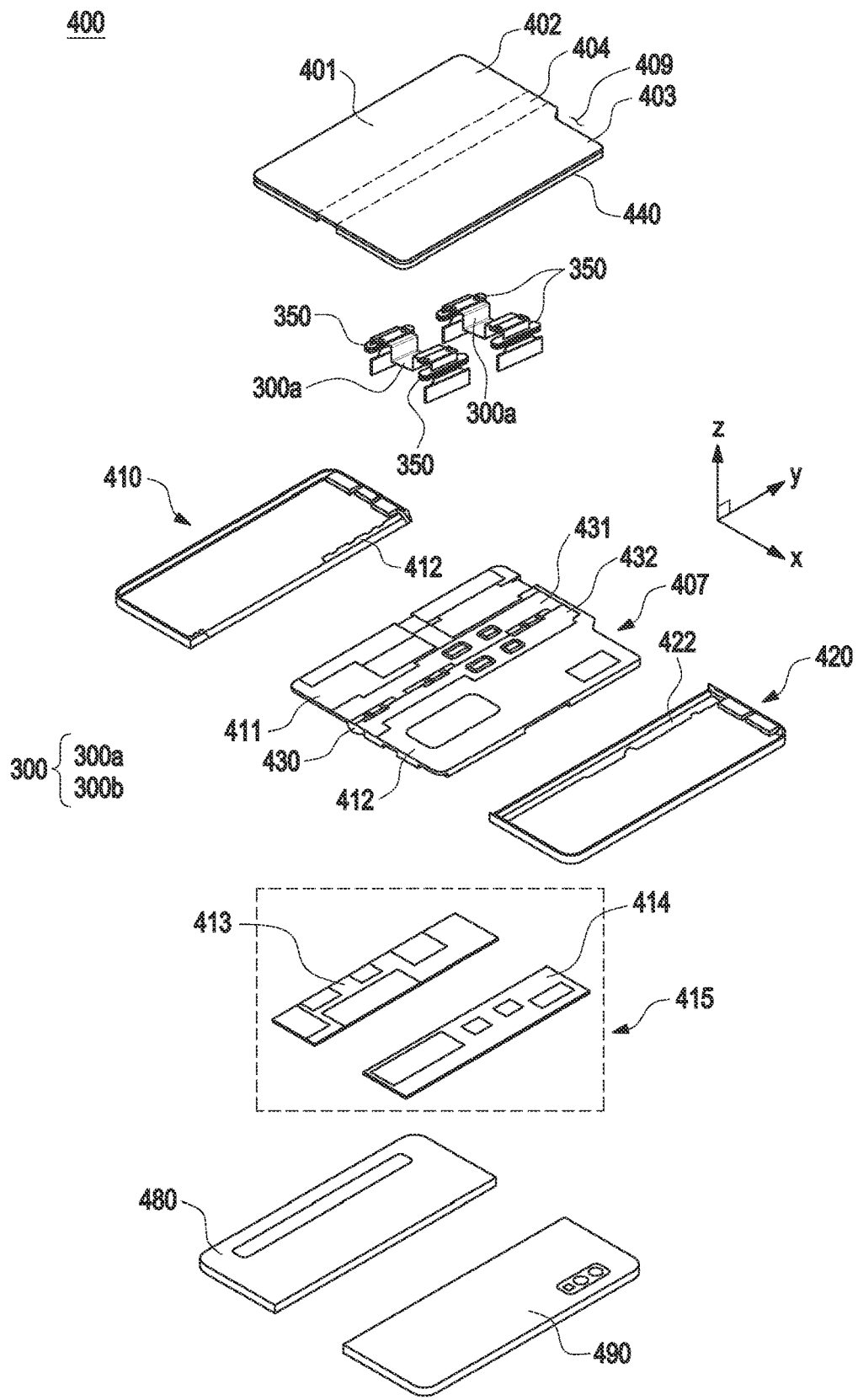
FIG. 4C is an exploded perspective view illustrating an electronic device according to an embodiment of the disclosure.

FIG. 4C is an exploded perspective view illustrating an electronic device according to an embodiment of the disclosure.

Referring to FIG. 4C, in an embodiment, an electronic device 400 may include a display unit 406, a bracket assembly 407, a board unit 415 (e.g., the printed circuit board 530a or 530b of FIGS. 5A to 5C), a first housing structure 410, a second housing structure 420, flexible printed circuit boards (the flexible printed circuit board 330 described above in connection with FIGS. 3A to 3E), a first rear cover 480, and a second rear cover 490. In the disclosure, the display unit 406 may be referred to as a display module or display assembly.

The display unit 406 may include a display 401 and one or more plates or layers 440 on which the display 401 is seated. According to an embodiment, the plate 440 may be disposed between the display panel 401 and the bracket assembly 407. The display 401 may be disposed on at least a portion of one surface (e.g., an upper surface of FIG. 4C) of the plate 440. The plate 440 may be formed in a shape corresponding to the display 401. For example, a portion of the plate 440 may be formed in a shape corresponding to the notch 409 of the display 401.

The bracket assembly 407 may include a first bracket 411, a second bracket 412, a hinge structure (not shown) disposed between the first bracket 411 and the second bracket 412, a hinge cover 430 covering the hinge structure when the hinge structure is viewed from the outside, and flexible printed circuit boards 300 crossing the first bracket 411 and the second bracket 412. The flexible printed circuit boards 300 may be disposed in a direction (e.g., the x-axis direction) crossing the first bracket 411 and the second bracket 412. The flexible printed circuit boards 300 may be disposed in a direction (e.g., the x-axis direction) perpendicular to the folding axis (e.g., the folding axis A of FIG. 4A or the y axis) of the folding area 404404. For example, as a plurality of through holes are formed in each of the housing structures 410 and 420, the flexible printed circuit boards 300 may be provided. The flexible printed circuit boards 300 may be disposed on the hinge cover 430 (or the hinge structure (not shown) wrapped around the hinge cover 430). For example, the wiring portion 320 of each of the flexible printed circuit boards 300 may be bent and disposed on part of the brackets 411 and 412 or the hinge cover 430 (or hinge structure (not shown)). Further, a reinforcement portion 330 connected to the wiring portion 320 of each of the flexible printed circuit boards (the flexible printed circuit boards 330 described above in connection with FIGS. 3A to 3F) may be disposed through the through hole formed in each of the housing structures (e.g., the first housing structure 410 and the second housing structure 420) (or brackets (e.g., the first bracket 411 and the second bracket 412)). An example in which the flexible printed circuit board 300 is disposed is further described below with reference to FIGS. 5A to 5C.

In an embodiment, the bracket assembly 407 may be disposed between the plate 440 and the circuit board unit 415. As an example, the first bracket 411 may be disposed between the first area 402 of the display 401 and a first circuit board 413. The second bracket 412 may be disposed between the second area 403 of the display 401 and a second circuit board 414.

As mentioned above, the circuit board unit 415 may include the first circuit board 413 disposed on the first bracket 411 and the second circuit board 414 disposed on the second bracket 412. The first circuit board 413 and the second circuit board 414 may be disposed inside a space formed by the bracket assembly 407, the first housing structure 410, the second housing structure 420, the first rear cover 480, and the second rear cover 490. Components for implementing various functions of the electronic device 400 may be disposed on the first circuit board 413 and the second circuit board 414.

The first housing structure 410 and the second housing structure 420 may be assembled together to be coupled to both sides of the bracket assembly 407, with the display unit 406 coupled to the bracket assembly 407. As described below, the first housing structure 410 and the third housing structure 420 may slide from both sides of the bracket assembly 407 and fit with the bracket assembly 407.

According to an embodiment, the first housing structure 410 may include a first rotation supporting surface 412, and the second housing structure 420 may include a second rotation supporting surface 422 corresponding to the first rotation supporting surface 412. The first rotation supporting surface 412 and the second rotation supporting surface 422 may include a curved surface corresponding to a curved surface included in the hinge cover 430.

According to an embodiment, the first rotation supporting surface 412 and the second rotation supporting surface 422, in the unfolded state of the electronic device 400 (e.g., the electronic device of FIG. 4A), may cover the hinge cover 430, allowing the hinge cover 430 to be not or minimally exposed to the rear surface of the electronic device 400. The first rotation supporting surface 412 and the second rotation supporting surface 422, in the folded state of the electronic device 400 (e.g., the electronic device of FIG. 4B), may rotate along the curved surface included in the hinge cover 430, allowing the hinge cover 430 to be maximally exposed to the rear surface of the electronic device 400.

Hereinafter, an example of a flexible printed circuit board disposed inside the electronic device 400 is described with reference to FIGS. 5A to 5C.

Figure 5A:
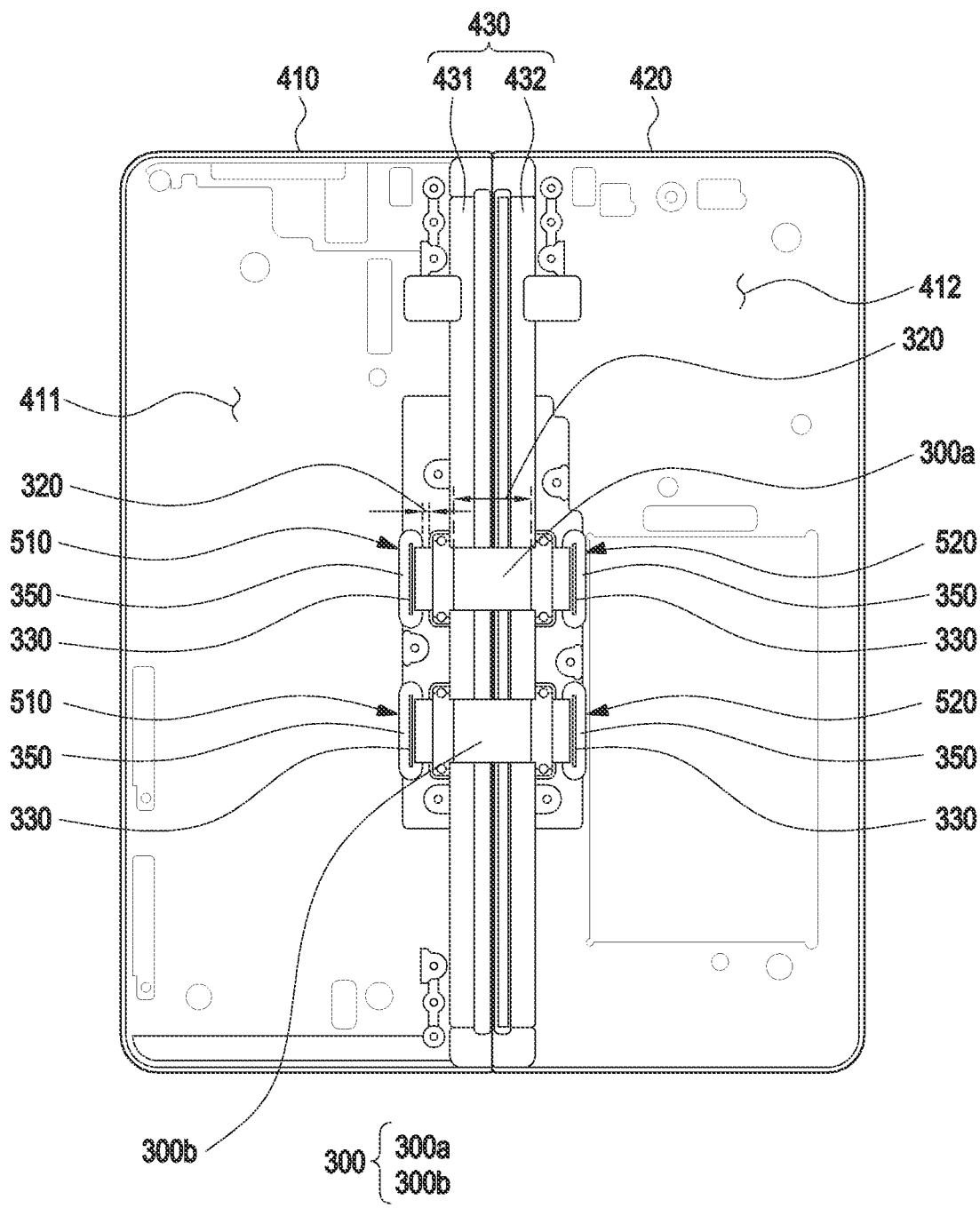
FIG. 5A is a view illustrating an example of an arrangement relationship of internal components of an electronic device in an unfolded state according to an embodiment of the disclosure.

FIG. 5A is a view illustrating an example of an arrangement relationship of internal components of an electronic device 400 in an unfolded state according to an embodiment of the disclosure. FIG. 5B is a view illustrating an example of an arrangement relationship of internal components of an electronic device 400 in an unfolded state, as viewed from a side surface, according to an embodiment of the disclosure. FIG. 5C is a view illustrating an example of a flexible printed circuit board passing through a through hole formed in a housing structure (or bracket) of an electronic device 400 in an unfolded state according to an embodiment of the disclosure.

According to various embodiments, FIG. 5A illustrates a state in which the hinge structure, the display 401, and the bezel are removed from the electronic device 400. According to various embodiments, as shown in FIG. 5A, the electronic device 400 may include a foldable housing including a folding area H in which the electronic device 400 is substantially folded around a folding axis, and the foldable housing may include a first housing structure 410 and a second housing structure 420. As described above, each of the first housing structure 410 and the second housing structure 420 may be integrally formed or assembled with rear covers (e.g., the first rear cover 480 and the second rear cover 490), hinge covers (e.g., the first hinge cover 431 and the second hinge cover 432), and brackets (e.g., the first bracket 411 and the second bracket 412). According to various embodiments, FIG. 5B shows a side surface of FIG. 5A. Referring to FIG. 5B, inner spaces 201 may be formed by the housing structures (e.g., the first housing structure 410 and the second housing structure 420), the rear covers (e.g., the first rear cover 480 and the second rear cover 490), the hinge covers (e.g., the first hinge cover 431 and the second hinge cover 432), and the brackets (e.g., the first bracket 411 and the second bracket 412), and the inner spaces 201 may be defined as waterproof areas. For example, the waterproof areas 201 may be formed which are surrounded by the lower surface of the brackets (e.g., the first bracket 411 and the second bracket 412), the upper surface of the rear covers (e.g., the first rear cover 480 and the second rear cover 490) facing it, and the hinge covers (e.g., the first hinge cover 431 and the second hinge cover 432). Each of the waterproof areas 201 may be formed corresponding to each of the housing structures (e.g., the first housing structure 410 and the second housing structure 420). Through holes 510 and 520 may be formed in at least part (e.g., the brackets 411 and 412) of the respective upper portions of the housing structures (e.g., the first housing structure 410 and the second housing structure 420). For example, referring to FIGS. 5A and 5B, as the electronic device 400 is observed from the top down (e.g., when observed in the −z-axis direction), a first through hole 510 (or opening) may be prepared to penetrate the first bracket 411 from the top to bottom, and a second through hole 520 may be prepared to penetrate the second bracket 412 from the top to bottom. As described above, the through holes 510 and 520 may be closed by the waterproofing member 350 provided in a portion (e.g., the reinforcement portion 330) of the flexible printed circuit board 300. The outside area of the through holes 510 and 520 may be defined as a non-waterproof area 202. A space 201 formed between the upper surface of the hinge covers 431 and 432 and the lower surface of the flexible display 401 (or the plate on which the flexible display 401 is disposed) facing the upper surface of the brackets 411 and 412 may be the waterproof area.

According to various embodiments, the flexible printed circuit boards 300 (e.g., the first flexible printed circuit board 300a and the second flexible printed circuit board 300b) may be disposed, on the components of the electronic device 400, to cross the two housing structures (e.g., the first housing structure 410 and the second housing structure 420). The flexible printed circuit boards 300 (e.g., the first flexible printed circuit board 300a and the second flexible printed circuit board 300b) may be disposed in parallel to each other and spaced apart from each other by a predetermined distance and be disposed in a structure in which they correspond to each other.

Figure 5B:
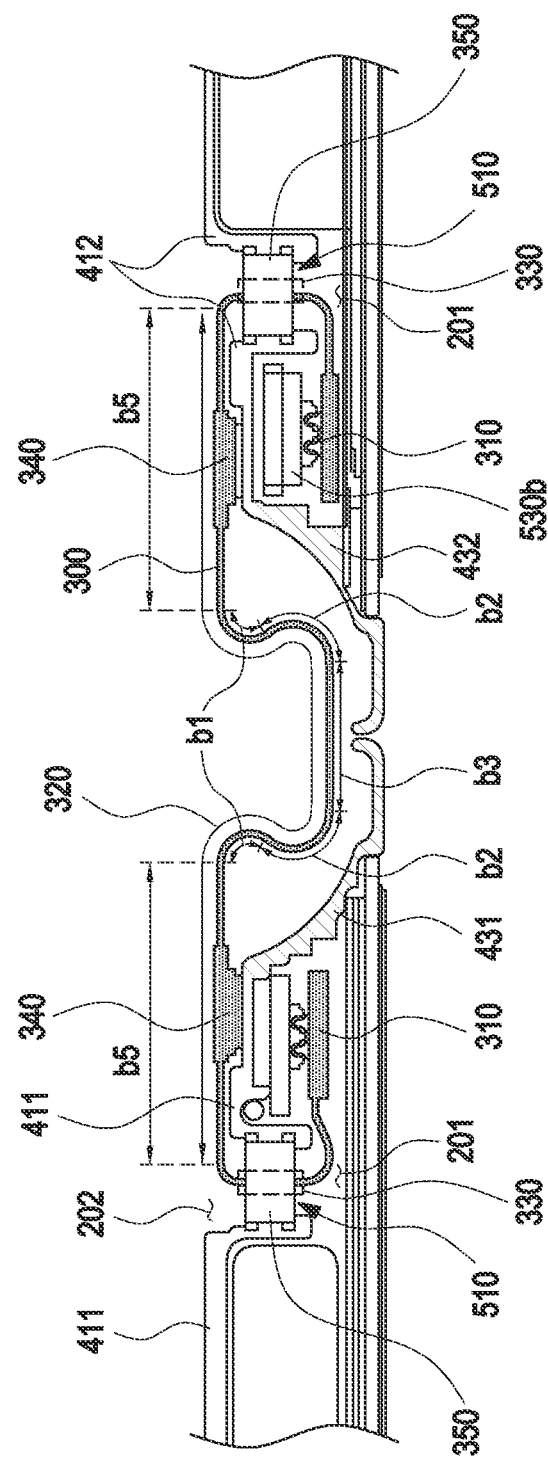
FIG. 5B is a view illustrating an example of an arrangement relationship of internal components of an electronic device in an unfolded state, as viewed from a side surface, according to an embodiment of the disclosure.

According to various embodiments, referring to FIGS. 5A and 5B, the flexible printed circuit boards 300 may be disposed in the waterproof areas 201 and the non-waterproof areas 202.

For example, referring to FIGS. 5A and 5B, a portion (e.g., the wiring portion 320) of each of the flexible printed circuit boards 300 may be disposed in the non-waterproof area 202. As an example, referring to FIG. 5A, when the electronic device 400 is observed from the top down (e.g., when observed in the −z-axis direction), the wiring portion 320 connected between the respective reinforcement portions 330 of the flexible printed circuit boards 300 may be disposed to overlap the upper surface of the hinge covers 431 and 432 (e.g., the first hinge cover 431 and the second hinge cover 432) and part of the brackets 411 and 412. Referring to FIG. 5B, first portions b1 of the wiring portion 320 connected between the respective reinforcement portions 330 of the flexible printed circuit boards 300 may be bent away from the hinge covers 431 and 432 or the rear covers 480 and 490, and second portions b2 may be bent toward the hinge covers 431 and 432 or the rear covers 480 and 490. Accordingly, the lower surface of a third portion b3 between the second portions b2 of the wiring portion 320 may be disposed to face the upper surface of the hinge covers 431 and 432 (or hinge structure (not shown)), and the lower surface of a fourth portion b4 connected between each of the second portions b2 of the wiring portion 320 and each of the first portions b1 may be disposed to face the bent surface of each of the hinge covers 431 and 432. The lower surface of a fifth portion b5 of the wiring portion 320 connected with each of the first portions b1 of the wiring portion 320 and each of the reinforcement portions 330 may be disposed to face the upper surface of at least part of each of the brackets 411 and 412. As shown in FIG. 5B, a fixing member may further be disposed between the lower surface of the fifth portion b5 of the wiring portion 320 and the upper surface of at least part of each of the brackets 411 and 412, to support the fifth portion b5 of the wiring portion 320. For example, the fifth portion b5 may include the above-described fixing portion 340. Referring to FIG. 5B, the fixing portion 340 may be disposed on the fixing member disposed on the upper surface of at least part of each of the brackets 411 and 412 and, as the holes of the fixing portion 340 and the holes of the fixing member are coupled, the flexible printed circuit board 300 may be firmly supported.

Figure 5C:
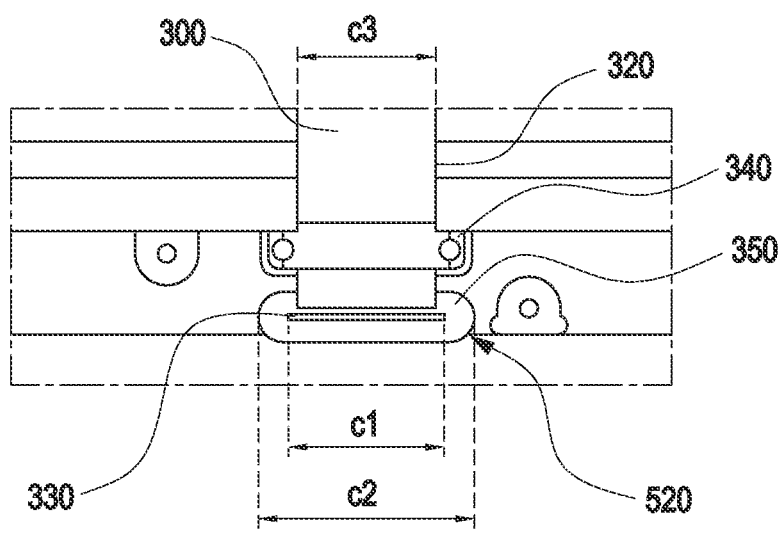
FIG. 5C is a view illustrating an example of a flexible printed circuit board passing through a through hole formed in a housing structure (or bracket) of an electronic device in an unfolded state according to an embodiment of the disclosure.

As another example, referring to FIGS. 5A to 5C, a portion of each of the flexible printed circuit boards 300 may pass through the through hole 510 or 520 and be disposed in the waterproof area 201. For example, the respective reinforcement portions 300 of the above-described flexible printed circuit boards 300 may be disposed to pass through the through holes 510 and 520. According to various embodiments, FIG. 5C is an enlarged view of a structure in which one reinforcement portion 330 of one flexible printed circuit board 300 passes through one through hole 510 or 520 formed in part of one housing structure (e.g., the first housing structure 410 (or one bracket (e.g., the first bracket 411))). Referring to FIG. 5C, as the waterproofing member 350 disposed to surround the reinforcement portion 330 is coupled into the through hole 520, the reinforcement portion 330 may pass through the through hole 520. For example, as described above, as the body portion 351 and coupling portion 352 of the waterproofing member 350 are coupled to the through hole 510, the waterproofing member 350 may be firmly supported in the through hole 510 or 520 so that the gap between the reinforcement portion 330 and the through hole 510 or 520 may be closed by the waterproofing member 350. Referring to FIG. 5C, the width c1 of the reinforcement portion 330 may be implemented to be proportional to the width c2 of the through hole 510. Further, the width c1 of the reinforcement portion 330 may be formed to be larger than the width c3 of the wiring portion 320 connected to the reinforcement portion 330. As described above, the plurality of layers 301 of the reinforcement portion 330 may be bonded by the bonding member 332 so that the reinforcement portion 330 may have rigidity. Accordingly, the rigidity of the reinforcement portion 330 may be enhanced, and further enhanced rigidity may be provided from the reinforcement portion 330 to the waterproofing member 350. Accordingly, the waterproofing member 350 may be robust against external force. Further, as the plurality of layers 301 of the reinforcement portion 330 of the flexible printed circuit board 300 passing through the through hole 510 and/or inserted into the waterproofing member 350 are bonded by the bonding member 332, the gap through which a predetermined fluid may enter the waterproof area 201 may be closed, enhancing the waterproofness of the waterproof area 201. Since the flexible printed circuit board 300 may be implemented as described above in connection with FIGS. 3A to 3F, no further duplicate description of the flexible printed circuit board 300 is given.

As another example, referring to FIGS. 5A and 5B, end portions (e.g., a first end portion and a second end portion) of the wiring portion 320 extending from the reinforcement portion 330 of each of the flexible printed circuit boards 300 may be disposed in the non-waterproof area 202. The end portion of each of the flexible printed circuit boards 300 may be electrically connected to at least one electric component disposed in the non-waterproof area 202. For example, the at least one electric component may include a printed circuit board (PCB) 530a and 530b. For example, referring to FIG. 5B, members for supporting the printed circuit boards 530a and 530b may be disposed in the waterproof areas 201, and the printed circuit boards 530a and 530b may be disposed in the supporting members. Various components (e.g., a camera device (not shown) and a receiver module (not shown)) may further be provided on the printed circuit boards 530a and 530b. In the disclosure, the number and arrangement of various components on the printed circuit boards 530a and 530b are not limited to the described embodiment and various arrangements are also possible according to embodiments. According to an embodiment, a plurality of connectors C may be formed on the first printed circuit board 530a and the second printed circuit board 530b to electrically connect the various components (e.g., transfer of control signals, power, or communication signals). As the plurality of connectors C formed on the first printed circuit board 530a and the second printed circuit board 530b, various types of connecting structures (or connector structures) may be adopted, such as flexible printed circuit (FPC) or flexible flat cable (FFC) type, board-to-board (B-to-B) type, zip type, bonding type formed through hot bar process, low insertion force (LIF), or zero insertion force (ZIF), and the relevant components may thereby be electrically coupled. According to various embodiments of the disclosure, the electronic device 400 may adopt a connector-to-connector (C-to-C) type (C2C type) electrical connecting structure (or connector structure) for connecting two different connectors C, as well as various types of connecting structures. The connector portions 310 formed at the end portions (e.g., the first end portion and the second end portion) of the flexible printed circuit boards 300 may be electrically connected to the respective connectors of the printed circuit boards 530a and 530b disposed in the waterproof areas 201. Accordingly, the electric components (e.g., the printed circuit boards 530a and 530b) disposed in the waterproof areas 201 through the flexible printed circuit board 300 may be electrically connected. Meanwhile, without limited to those described and/or shown, the flexible printed circuit board 300 may electrically connect the electric component disposed in the waterproof area 201 and the electric component disposed in the non-waterproof area 202. For example, one end portion (e.g., the connector portion 310) of the flexible printed circuit board 300 may be electrically connected to an electric component (e.g., the printed circuit board 530a or 530b) disposed in the waterproof area, and another end may be electrically connected to an electric component disposed in the non-waterproof area 202.

Hereinafter, another example of an electronic device including a plurality of areas (e.g., the waterproof area 201 and the non-waterproof area 202) and a flexible printed circuit board 300 disposed between the plurality of areas is described. Since the description made above in connection with FIGS. 1, 2A, 2B, and 3A to 3F may be applied to the following descriptions, no duplicate description is given. Further, since the foldable electronic device 600 described below may be implemented like the foldable electronic device 400 described in connection with FIGS. 4A to 4C and 5A to 5C, no duplicate description is given.

Figure 6A:
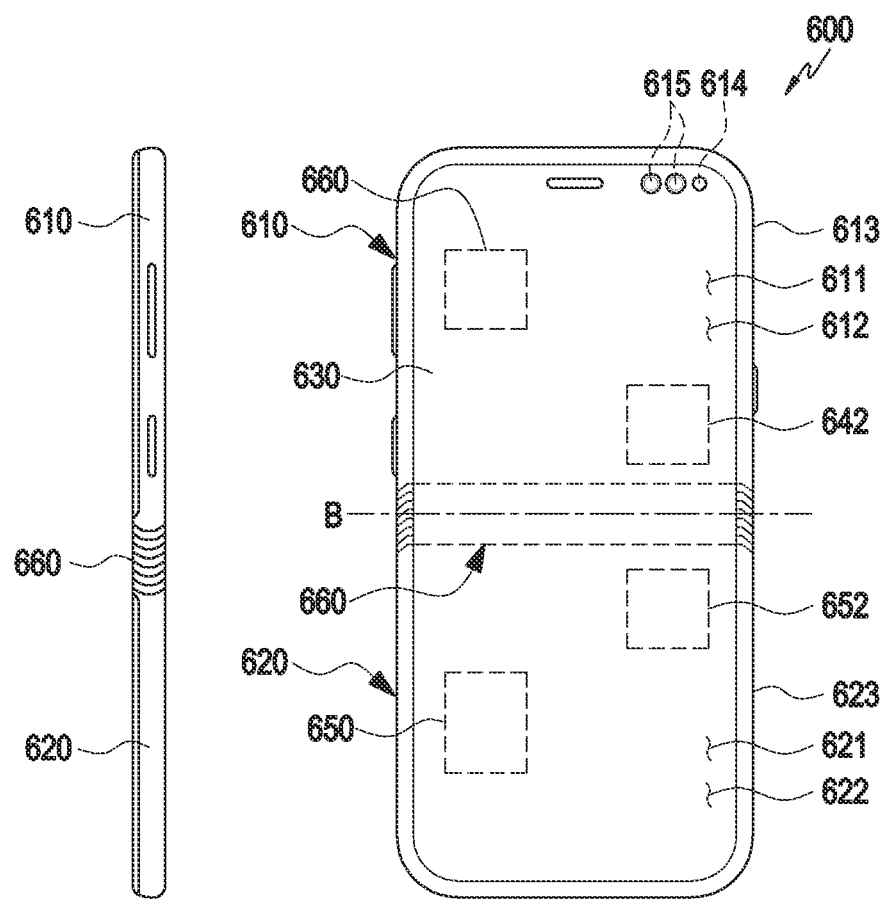
FIG. 6A is a view illustrating an unfolded state of an electronic device with respect to a specific folding direction according to an embodiment of the disclosure.

FIG. 6A is a view illustrating an unfolded state of an electronic device 600 with respect to a specific folding direction according to an embodiment of the disclosure.

Referring to FIG. 6A, an electronic device 600 may include a pair of housing structures, e.g., a first housing structure 610 and a second housing structure 620 (or foldable housing structure), pivotably coupled to each other about a folding axis B through a housing structure 660 to be folded to each other and a display 630 (e.g., a flexible display or foldable display) disposed in a space formed by the pair of housing structures (e.g., the first housing structure 610 and the second housing structure 620). As compared with the electronic device 400 of FIGS. 4A to 4C and 5A to 5C, the electronic device 600 in an unfolded state as shown in FIG. 6A, described below, may only differ in the shape of the display due to the folding axis in a different direction, but each component may be operated in the same manner. The pair of housing structures (e.g., the first housing structure 610 and the second housing structure 620), a housing structure 660 (or hinge cover (not shown)), rear covers 680 (e.g., a first rear cover 681 and a second rear cover 682), and bracket assemblies (e.g., a first bracket assembly 613 and a second bracket assembly 624) may be integrally configured or assembled. Accordingly, inner spaces (e.g., waterproof areas 201) may be formed by the pair of housing structures (e.g., the first housing structure 610 and the second housing structure 620), the hinge structure 660 (or hinge cover (not shown)), the rear covers 680 (e.g., the first rear cover 681 and the second rear cover 682), and the bracket assemblies (e.g., the first bracket assembly 613 and the second bracket assembly 624), and at least one electric component (e.g., the printed circuit board 530) may be disposed in the inner spaces. Further, an inner space (e.g., non-waterproof area 202) separated from the above-described waterproof area 201 may also be formed between at least part of the housing structures (e.g., the first housing structure 310 and the second housing structure 320) (e.g., at least part of the bracket assemblies coupled to the housing structures) and the flexible display 630 (or a plate on which the flexible display 630 is disposed). Through holes 710 and 720 may be formed in at least part of the housing structures (e.g., the first housing structure 310 and the second housing structure 320) (or at least part of the bracket assemblies (e.g., the first bracket assembly 613 and the second bracket assembly 624) coupled to the housing structures), and the flexible printed circuit board 300 may be disposed through the through holes 710 and 720. Accordingly, the flexible printed circuit board 300 may be disposed in at least part of the housing structures (e.g., the first housing structure 310 and the second housing structure 320). An example in which the flexible printed circuit board 300 is disposed is described below with reference to FIGS. 7A to 7C.

According to an embodiment, in the electronic device 600 of FIG. 6A, in the unfolded state, the display 401 may be configured in a second shape different from the first shape. For example, the second shape may include a second aspect ratio (16:9) different from the first aspect ratio (e.g., 4:3).

According to various embodiments, the first housing structure 610 and the second housing structure 620 may be disposed on two opposite sides of folding axis B (e.g., a horizontal folding axis).

According to an embodiment, the first housing structure 610 may include an area in which a camera 614 and various sensors 615 are disposed unlike the second housing structure 620 but, in the other areas, may be symmetric in shape. In another embodiment, the area in which the camera 614 and various sensors 615 are disposed may be additionally disposed in, or replaced with, at least a partial area of the second housing structure 620.

In another embodiment, at least part of the camera 614 or various sensors 615 may be disposed in at least a partial area of the first housing 610, and the remaining part may be disposed in at least a partial area of the second housing structure 620.

According to various embodiments, in the unfolded state of the electronic device 600, the first housing structure 610 may include a first surface 611 disposed to face the front surface of the electronic device 600, a second surface 612 facing in the direction opposite to the first surface 611, and a first side member 613 surrounding at least part of a space between the first surface 611 and the second surface 612. The first surface 611 may be replaced by, or integrally assembled with, the first bracket assembly described below.

According to various embodiments, in the unfolded state of the electronic device 600, the second housing structure 620 may include a third surface 621 disposed to face the front surface of the electronic device 600, a fourth surface 622 facing in the direction opposite to the third surface 621, and a second side member 623 surrounding at least part of a space between the third surface 621 and the fourth surface 622. The second surface 621 may be replaced by, or integrally assembled with, the second bracket assembly described below.

According to various embodiments, the camera 614 may be visually exposed on the front surface of the electronic device 600 through an opening provided in one corner of the first housing structure 610. The sensors 615 may include at least one of a proximity sensor, an illuminance sensor, an iris recognition sensor, an ultrasonic sensor, and an indicator. For example, the sensors 615 may be exposed on the front surface of the electronic device 600 through an opening provided in one corner of the first housing structure 610 or may be disposed at the lower end of at least a partial area of the display 401.

According to various embodiments, the first housing structure 610 may include a receiver 416 disposed through at least a partial area. In an embodiment, although not illustrated, the electronic device 600 may include an ear jack hole disposed through the first housing structure 610 and/or the second housing structure 620, an external speaker module, a SIM card tray, an interface connector port, or at least one key button.

According to various embodiments, the angle or distance between the first housing structure 610 and the second housing structure 620 may be varied depending on the unfolded state (flat state) (e.g., the state shown in FIG. 6A) of the electronic device 600, a folded state (e.g., the state shown in FIG. 6B described below), or an intermediate state. Without limited to those described, the electronic device may be determined as being in a closed state, open state, or half folded state depending on the angle between the first housing structure 610 and the second housing structure 620, which is described below. The term "state" may be interchangeably used with the term "mode."

According to various embodiments, depending on the angle between the first housing structure 610 and the second housing structure 620, the state (e.g., unfolded state, folded state, or intermediate state) of the electronic device may be set and, depending on the state of the electronic device (e.g., the state of the housings, the state of the hinge, or the bending state of the flexible display), an operation of displaying an execution screen of an application may be performed. An operation of displaying an execution screen of an application according to the state of the electronic device is described below.

According to various embodiments, the electronic device 600 may include a first motion sensor 651 and a magnetic body (e.g., a magnet) 652 disposed on at least a portion of the first housing structure 610. According to an embodiment, the first motion sensor 651 may be configured as a combination of at least two of an acceleration sensor, an angular velocity sensor (e.g., a gyro sensor), or a geomagnetic sensor. For example, the electronic device 600 may detect the pose and motion (gesture) of the first housing structure 610 through the first motion sensor 651. Specifically, the posture of the first housing structure 610 may be detected based on the acceleration sensor of the first motion sensor 651, and the motion of the first housing structure 610 may be detected based on the angular velocity sensor of the first motion sensor 651. According to an embodiment, the magnetic body 652 may be disposed on at least a portion of the first housing structure 610 adjacent to the hinge structure 660.

According to various embodiments, the electronic device 600 may include a second motion sensor 653 and a magnetic force sensor module 654 disposed on at least a portion of the second housing structure 620. According to an embodiment, the second motion sensor 653 may be configured as a combination of at least two of an acceleration sensor, an angular velocity sensor (e.g., a gyro sensor), or a geomagnetic sensor. For example, the electronic device 600 may detect the posture of the second housing structure 620 through the acceleration sensor of the second motion sensor 653 and may detect the movement of the second housing structure 620 through the angular velocity sensor of the second motion sensor 653. According to an embodiment, the magnetic force sensor module 654 may be disposed on at least a portion of the second housing structure 620 adjacent to the hinge structure 660. For example, the magnetic body 652 of the first housing structure 610 and the magnetic force sensor module 654 of the second housing structure 620 may be disposed to at least partially face each other in the folded state of the electronic device 600 as shown in FIG. 6B.

Figure 6B:
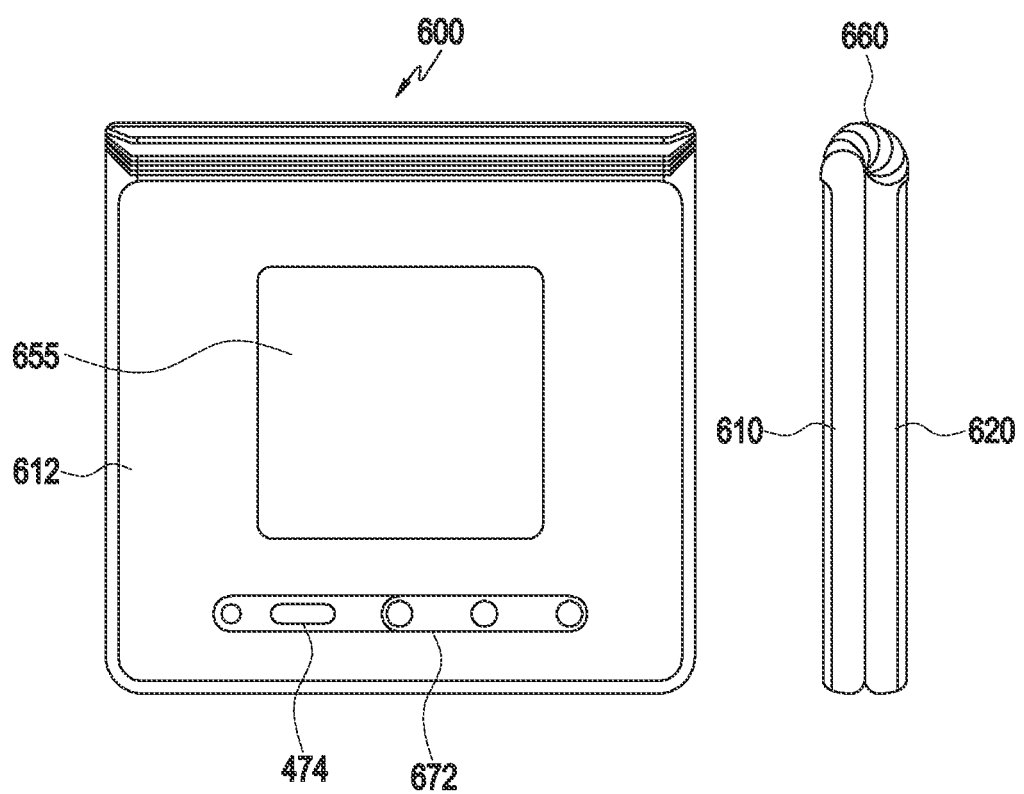
FIG. 6B is a view illustrating a folded state of an electronic device according to an embodiment of the disclosure.

FIG. 6B is a view illustrating a folded state of an electronic device 600 according to an embodiment of the disclosure.

According to various embodiments, an electronic device 600 may include a pair of housing structures 610 and 620 (e.g., foldable housing structures) pivotably coupled to each other about folding axis B through a hinge structure 660 to be folded on each other and a display 630 (e.g., a flexible display or foldable display) disposed in a space formed by the pair of housing structures 610 and 620.

According to various embodiments, the sensor may include a rear camera device 672 and/or a proximity sensor 474. According to an embodiment, at least a portion of a sub display 655 may be visually exposed through the rear surface 612 of the first housing structure 610.

According to various embodiments, one or more components may be arranged or visually exposed on/through the rear surface of the electronic device 600. According to an embodiment, one or more components or sensors may be visually exposed through the rear surface (second surface) 612 of the first housing structure 610. The sensor may include a rear camera device 672 and/or a proximity sensor 474. According to an embodiment, at least a portion of a sub display 655 may be visually exposed through the rear surface 612 of the first housing structure 610.

Figure 6C:
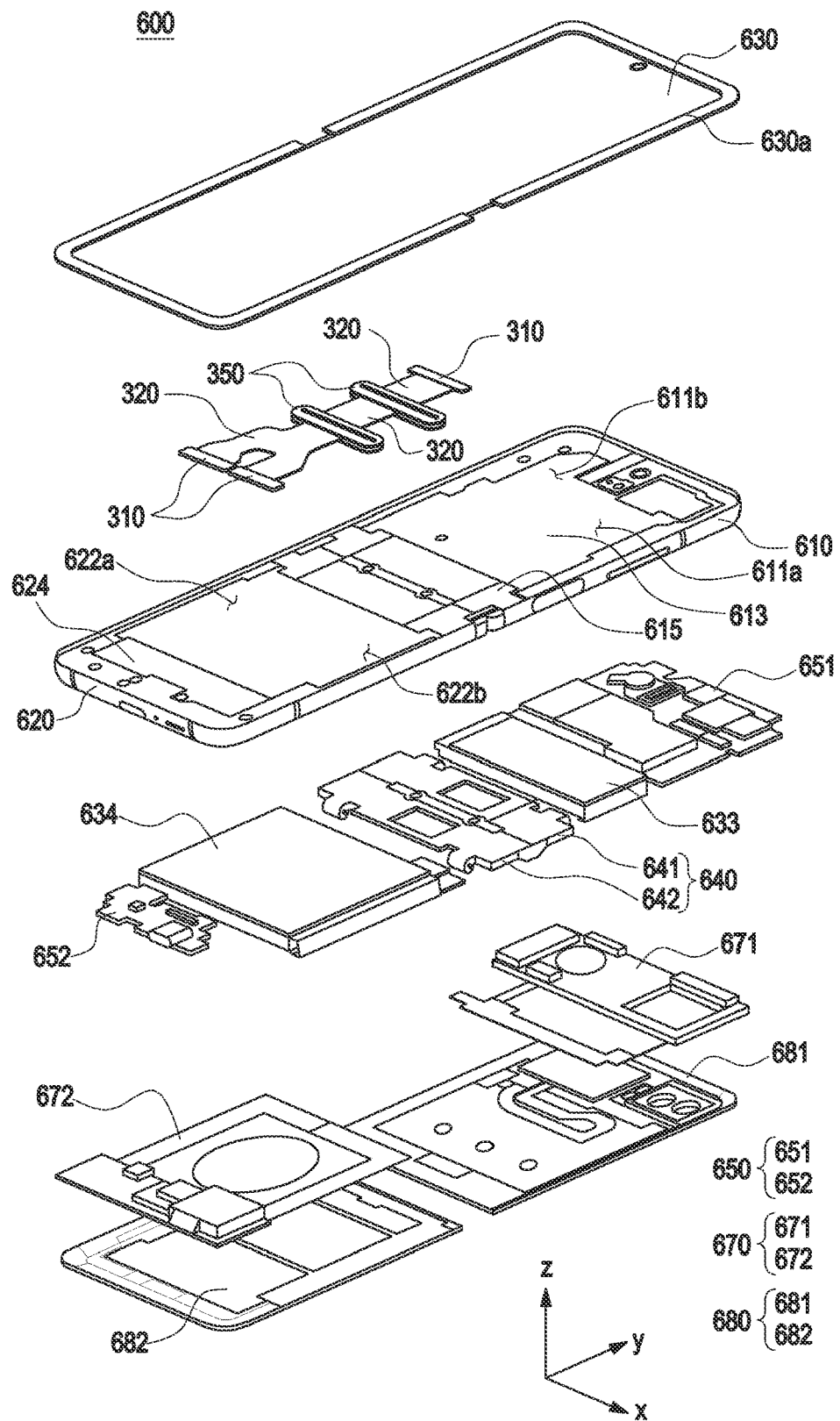
FIG. 6C is an exploded perspective view illustrating an electronic device according to an embodiment of the disclosure.

FIG. 6C is an exploded perspective view illustrating an electronic device 600 according to an embodiment of the disclosure.

Referring to FIG. 6C, in various embodiments, an electronic device 600 may include a display 630 (e.g., the display 630 of FIG. 6A), a foldable housing (e.g., the first housing structure 610 and the second housing structure 620 of FIG. 6A), a flexible printed circuit board 300, a printed circuit board 650, a hinge structure 640, an antenna module 670, and a rear cover 680. Hereinafter, detailed descriptions of the components overlapping those of FIGS. 6A and 6B (e.g., the display 630, the foldable housing, and the rear cover 680) will be omitted.

According to various embodiments, the display 630 may be exposed through a majority portion of the front plate 630a. According to an embodiment, the shape of the display 630 may be formed to be substantially the same as the shape of the periphery of the front plate 630a.

According to various embodiments, the foldable housing may include a first housing 610 and a second housing 620 (e.g., the first housing structure 610 and the second housing structure 620 of FIG. 6A). According to an embodiment, the first housing 610 may include a first surface 611a and a second surface 611b facing in a direction opposite to the first surface 611a. The second housing 620 may include a third surface 622a and a fifth surface 622b facing in a direction opposite to the third surface 622a. As described above, the foldable housing may additionally or alternatively include bracket assemblies (e.g., the first bracket assembly 613 and the second bracket assembly 624), a hinge structure 660 (or a hinge cover (not shown)), and rear covers 680 (e.g., the first rear cover 681 and the second rear cover 682). For example, the bracket assemblies may include a first bracket assembly 613 disposed on the first housing structure 610 to form the first surface 611a and a second bracket assembly 624 disposed on the second housing structure 620 to form the third surface 620a. At least part of the bracket assemblies, e.g., a portion 625 including at least part of the first bracket assembly 613 and at least part of the second bracket assembly 624, may serve as a plate for supporting the housing structure 640 (e.g., the first hinge structure and the second hinge structure). The first hinge structure may be coupled to the first housing structure 610 to form one side surface of the first housing structure, and the second hinge structure may be coupled to the second housing structure 620 to form one side surface of the second housing structure. As another example, the first rear cover 681 may be coupled to the first housing structure 610 to form a lower surface of the first housing structure, and the second rear cover 682 may be coupled to the second housing structure 620 to form a lower surface of the second housing structure 620. Accordingly, as described above, inner spaces (e.g., the waterproof area 201) may be formed by the pair of housing structures (e.g., the first housing structure 610 and the second housing structure 620), a housing structure 660 (or hinge cover (not shown)), rear covers 680 (e.g., a first rear cover 681 and a second rear cover 682), and bracket assemblies (e.g., a first bracket assembly 613 and a second bracket assembly 624).

According to various embodiments, the flexible printed circuit board 300 may be disposed on at least a portion of the foldable housing 405. The flexible printed circuit board 300 may be disposed on the hinge structure 660 (or the hinge cover (not shown)). For example, the wiring portion 320 of each of the flexible printed circuit boards 300 may be bent and disposed on the hinge structure 660, a portion 625 of the bracket assembly (e.g., the first bracket assembly 613 and the second bracket assembly 624) supporting the hinge structure 660, and another portion of the bracket assembly (e.g., the first bracket assembly 613 and the second bracket assembly 624) connected to the portion 625 of the bracket assembly. Further, each reinforcement portion 330 connected to the wiring portion 320 of the flexible printed circuit board 300 may be disposed to pass through the through hole 710 and 720 formed in each of the housing structures (e.g., the first housing structure 310 and the second housing structure 320) (or the bracket assemblies (e.g., the first bracket assembly 613 and the second bracket assembly 624)). Unlike those described above in connection with FIGS. 5A and 5B, the flexible printed circuit board 300 is implemented so that a plurality of wiring portions 320 (e.g., two wiring portions) extend from the reinforcement portion 330. However, the other portions may be implemented as described above in connection with FIGS. 3A to 3F, and thus, no duplicate description is given.

According to various embodiments, various electric components may be disposed on the printed circuit board 650. For example, a processor (e.g., the processor 120 of FIG. 1), a memory (e.g., the memory 130 of FIG. 1), and/or an interface (e.g., the interface 177 of FIG. 1) may be mounted on the printed circuit board 650. The processor may include one or more of, e.g., a central processing unit, an application processor, a graphic processing device, an image signal processing, a sensor hub processor, or a communication processor. The memory may include, e.g., a volatile or non-volatile memory. The interface may include, e.g., a high definition multimedia interface (HDMI), a universal serial bus (USB) interface, a secure digital (SD) card interface, and/or an audio interface. The interface may electrically or physically connect, e.g., the electronic device 600 with an external electronic device and may include a USB connector, an SD card/multimedia card (MMC) connector, or an audio connector.

According to various embodiments, the printed circuit board 650 may include a first printed circuit board 651 disposed on the side of the first bracket assembly 613 and a second printed circuit board 652 disposed on the side of the second bracket assembly 624. The first printed circuit board 651 and the second printed circuit board 652 may be disposed inside the spaces (e.g., waterproof areas 201) formed by the foldable housing 405, bracket assemblies, first rear cover 681 and/or second rear cover 682. Components for implementing various functions of the electronic device 600 may be separately disposed on the first printed circuit board 651 and the second printed circuit board 652. For example, a processor may be disposed on the first printed circuit board 651, and an audio interface may be disposed on the second printed circuit board 652. The printed circuit boards (e.g., the first printed circuit board 651 and the second printed circuit board 652) may be electrically connected by the end portions (e.g., the connector portion 310) connected to the reinforcement portions 330 of the flexible printed circuit board 300 passing through the through holes 710 and 720.

According to various embodiments, a battery may be disposed adjacent to the printed circuit board 650 to supply power to the electronic device 600. At least a portion of the battery may be disposed on substantially the same plane as the printed circuit board 650. According to an embodiment, a first battery 633 may be disposed adjacent to the first printed circuit board 651, and a second battery 634 may be disposed adjacent to the second printed circuit board 652. The battery may be a device for supplying power to at least one component of the electronic device 600. The battery 189 may include, e.g., a primary cell which is not rechargeable, a secondary cell which is rechargeable, or a fuel cell. The battery may be integrally or detachably disposed inside the electronic device 600.

According to various embodiments, the hinge structure 640 may be a component for supporting the foldable housing 405 and/or bracket assembly to allow the foldable housing to rotate about the folding axis (e.g., A-A' of FIG. 2A). The hinge structure 640 may include a first hinge structure 641 disposed on the side of the first printed circuit board 651 and a second hinge structure 642 disposed on the side of the second printed circuit board 652. The hinge structure 640 may be disposed between the first printed circuit board 651 and the second printed circuit board 652. According to an embodiment, the hinge structure 640 may be formed substantially integrally with the portion 625 including at least a portion of the first bracket assembly 613 and at least a portion of the second bracket assembly 624.

According to various embodiments, the antenna module 670 may be disposed between the rear cover 680 and the battery. The antenna module 670 may include, e.g., a near-field communication (NFC) antenna 671, a wireless charging antenna 672, and/or a magnetic secure transmission (MST) antenna. The antenna module 670 may perform short-range communication with, e.g., an external device or may wirelessly transmit or receive power necessary for charging. According to another embodiment, an antenna structure may be formed by a portion or combination of the side bezel structure of the foldable housing and/or bracket assembly.

According to various embodiments, the rear cover 680 may include a first rear cover 681 and a second rear cover 682. The rear cover 680 may be combined with the foldable housing to protect the above-described components (e.g., the printed circuit board 650, the battery, and the antenna module 670) disposed in the foldable housing 405. As described above, the rear cover 680 may be configured substantially integrally with the foldable housing 405.

Hereinafter, an example of the flexible printed circuit board 300 disposed inside the electronic device 600 is described with reference to FIGS. 7A to 7C.

Figure 7A:
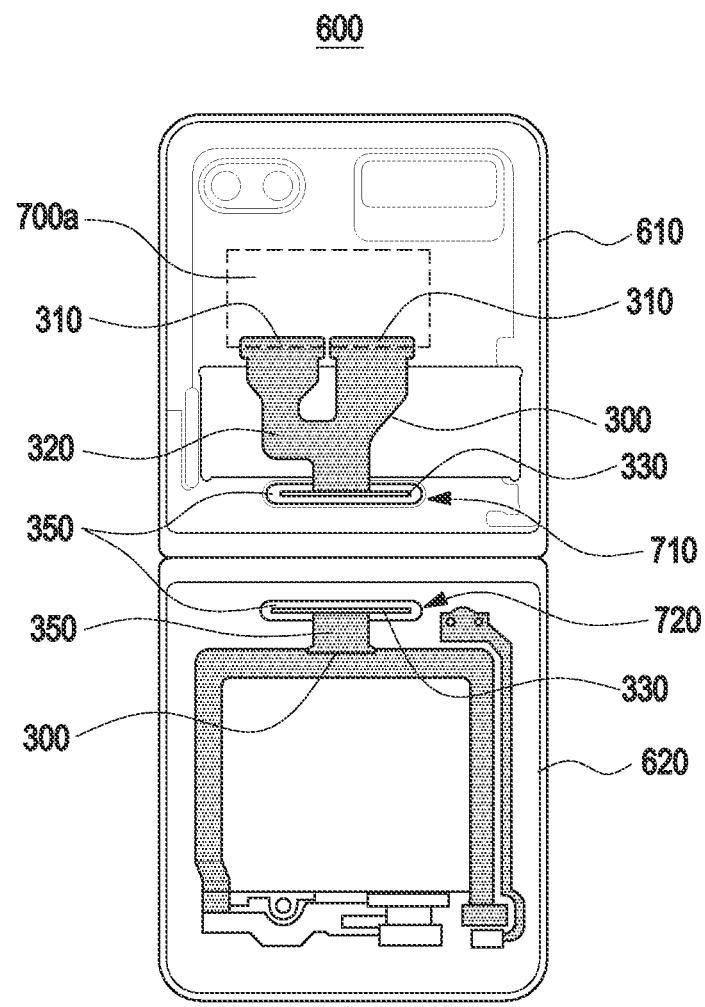
FIG. 7A is a view illustrating an example of an arrangement relationship of internal components of an electronic device in an unfolded state according to an embodiment of the disclosure.
Figure 7B:
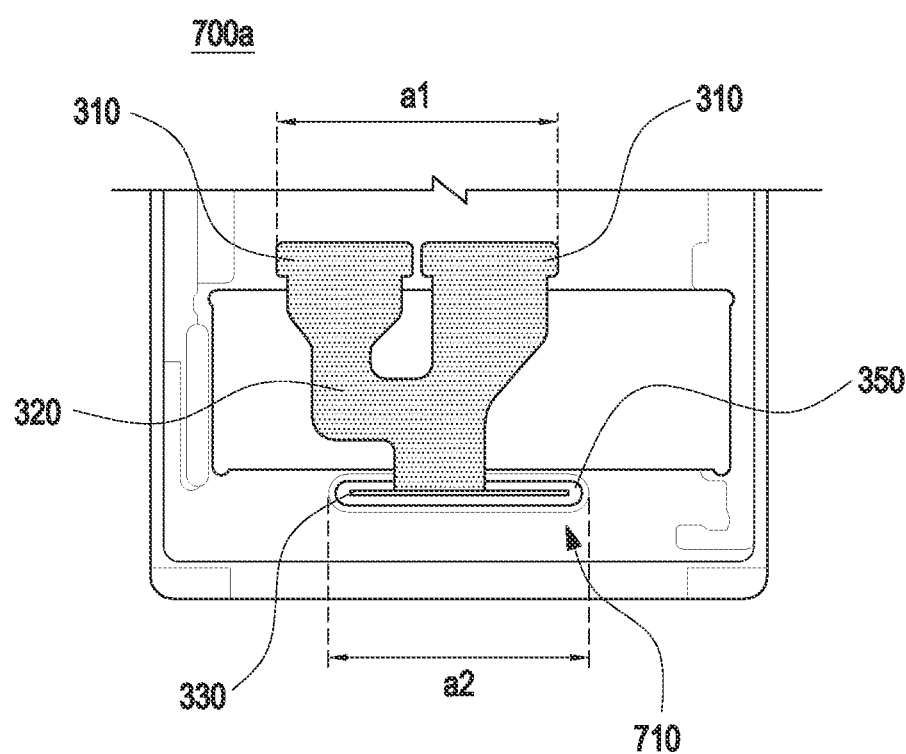
FIG. 7B is a view illustrating an example of a flexible printed circuit board passing through a through hole formed in a housing structure (or bracket assembly) of an electronic device in an unfolded state according to an embodiment of the disclosure.
Figure 7C:
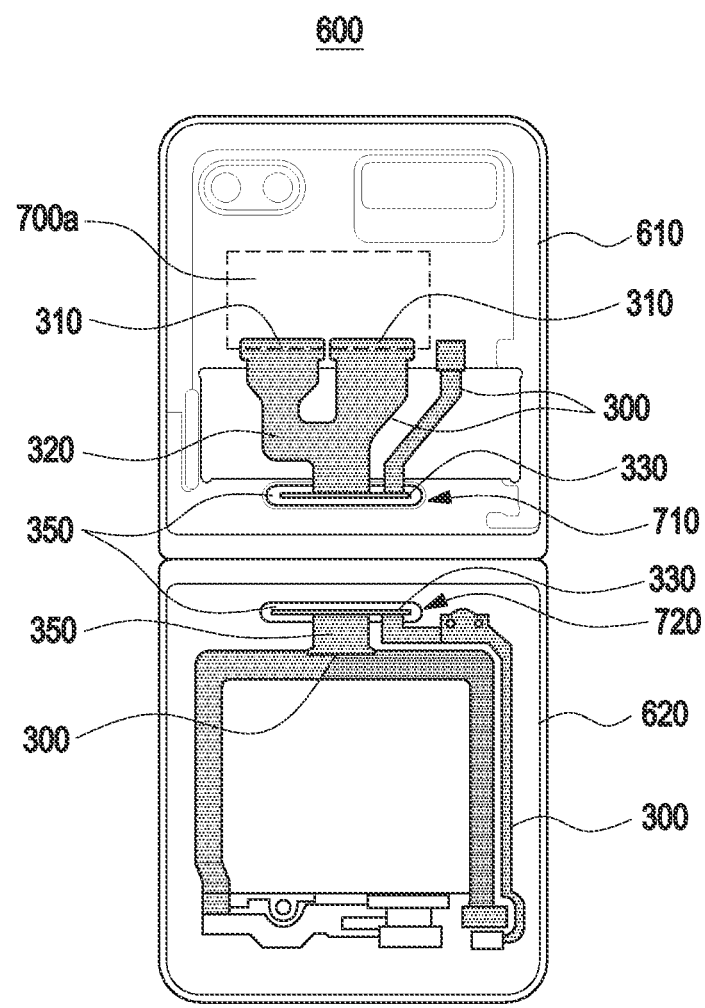
FIG. 7C is a view illustrating another example of an arrangement relationship of internal components of an electronic device in an unfolded state according to an embodiment of the disclosure.

FIG. 7A is a view illustrating an example of an arrangement relationship of internal components of an electronic device 600 in an unfolded state according to an embodiment of the disclosure. FIG. 7B is a view illustrating an example of a specific portion 700a of a flexible printed circuit board 300 passing through a through hole 710 and 720 formed in a housing structure (or bracket assembly) of an electronic device 600 in an unfolded state according to an embodiment of the disclosure. FIG. 7C is a view illustrating another example of an arrangement relationship of internal components of an electronic device 600 in an unfolded state according to an embodiment of the disclosure.

According to various embodiments, FIG. 7A illustrates a state in which the rear covers 680 are removed from the electronic device 600. According to various embodiments, as shown in 701 of FIG. 7A, the electronic device 600 may include a foldable housing including a folding area H in which the electronic device 600 is substantially folded around a folding axis, and the foldable housing may include a first housing structure 610 and a second housing structure 620.

According to various embodiments, referring to FIG. 7A, the flexible printed circuit board 300 may be disposed across the first housing structure 610 and the second housing structure 620 of the electronic device 600. Unlike the flexible printed circuit boards 300 disposed in the electronic device 600 of FIGS. 5A and 5B, a single flexible printed circuit board 300 including a plurality of layers 301 may be disposed. Similar to those described above in connection with FIGS. 5A and 5B, the flexible printed circuit board 300 may be disposed in the waterproof area 201 and the non-waterproof area 202 inside the electronic device 600. For example, as described above in connection with FIGS. 6A to 6C, the wiring portion 320 of the flexible printed circuit board 300 may be disposed on a portion of the bracket assembly, and each reinforcing portion 330 connected to the wiring portion 320 passes through the through hole 710 and 720 formed in the housing structure (e.g., the first housing structure 610 and the second housing structure 620) (or the bracket assemblies (e.g., the first bracket assembly 613 and the second bracket assembly 624)). No duplicate description is given. Although not shown, similar to those described above in connection with FIG. 5A, the wiring portion 320 of the flexible printed circuit board 300 may be bent with a predetermined curvature and disposed on the bracket assemblies (e.g., the first bracket assembly 613 and the second bracket assembly 624) and the hinge structure 660, and the fixing portion 340 may be supported on the bracket assemblies (e.g., the first bracket assembly 613 and the second bracket assembly 624). No duplicate description is given. Further, without limited to those described, referring to FIG. 7C, a plurality of flexible printed circuit boards 600a and 600b passing through the same through holes 710 and 720 may be disposed across over the first housing structure 610 and the second housing structure 620. As shown in FIG. 7C, the plurality of flexible printed circuit boards 600a and 600b may include reinforcing portions 330 connecting them. A plurality of flexible printed circuit boards 600a and 600b may be injection-molded, and the reinforcing portion 330 connecting the two plurality of flexible printed circuit boards 600a and 600b may be formed by a thermocompression process to be described below. Accordingly, the waterproofing member 350 surrounding the formed reinforcement portions 330 may be fitted into the through holes 710 and 720 as described above. Alternatively, without limited to those described and/or shown, each of the plurality of flexible printed circuit boards 600a and 600b may include a reinforcing portion 330. A plurality of through holes may be formed in each of the waterproofing members 350 so that the reinforcement portions 330 of the plurality of flexible printed circuit boards 600a and 600b may be individually fitted into the through holes.

According to various embodiments, as described above in connection with FIGS. 6A to 6C, the waterproof area 201 may be formed by the housing structure (e.g., the first housing structure 610 and the second housing structure 620), bracket assemblies (e.g., the first bracket assembly 613 and the second bracket assembly 624), the hinge structure 660, and the rear covers 680. FIG. 7A illustrates the flexible printed circuit board 300 passing through the through holes 710 and 720 formed in the bracket assemblies (e.g., the first bracket assembly 613 and the second bracket assembly 624). Referring to FIG. 7A, the waterproofing member 350 provided in the reinforcing portion 330 may be inserted into the through hole 710 and 720. The width of the waterproofing member 350 and the reinforcing portion 330 may be implemented as described above in connection with FIGS. 3A to 3F and FIGS. 5A to 5B, so that a duplicate description is omitted. Referring to FIG. 7A, a plurality of (e.g., two) wiring portions 320 may extend from the reinforcing portion 330, and connector portions 310 may be formed at the respective end portions of the wiring portions 320. Each of the formed connector portions 310 may be electrically connected to a respective one of the electrical components (e.g., a printed circuit board) provided in the waterproof area 201. The width a1 (e.g., the length in the Y-axis direction) of the two connector portions 310 may be implemented to be smaller than the width a2 (e.g., the length in the Y-axis direction) of the through hole 710 and may be implemented to be larger than or equal to the width a3 of the reinforcement portion 330. Referring to FIG. 7B, the width a3 of the reinforcement portion 330 may be larger than the width c1 of the reinforcement portion 330 described above in connection with FIGS. 5A and 5B. For example, the width a3 of the reinforcement portion 330 of the flexible printed circuit board 300 may be implemented in proportion to the width a1 of the connector portion 310. As the connector portion 310 of the flexible printed circuit board 300 is inserted into the through hole 710 and assembled, the width a2 of the through hole 710 may increase in proportion to the width a1 of the connector portion 310. Since the width a3 of the reinforcement portion 330 needs to increase in proportion to the increase in the width a2 of the through hole 710, the width a3 of the reinforcement portion 330 may be implemented in proportion to the width a1 of the connector portions 310. For example, the width of the above-described dummy area (e.g., the second area Y2) may increase in proportion to the increase in the width a2 of the through hole 710. Accordingly, the width a3 of the reinforcement portion 330 of the flexible printed circuit board 300 implemented in FIGS. 7A and 7B may be formed to be relatively larger based on the fact that the width a1 of the connector portions 310 of the flexible printed circuit board 300 implemented in FIGS. 7A and 7B is formed to be larger than the width of the connector portion 310 of the flexible printed circuit board 300 described above in connection with FIGS. 5A and 5B.

The foregoing description made above in connection with the figures preceding FIGS. 7A and 7B may be applied to what has been not described in connection with the examples of the connector portion 310, the wiring portion 320, the reinforcement portion 330, the fixing portion 340, and the waterproofing member 350. Thus, a further duplicate description is omitted.

An example of implementing (or forming) the flexible printed circuit board 300 according to various embodiments is described below.

Figure 8:
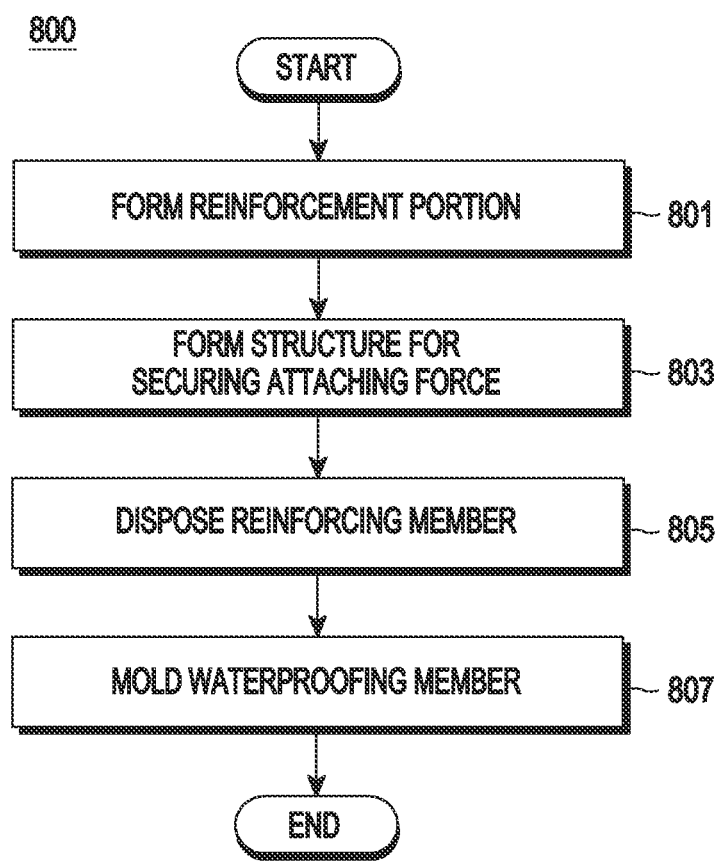
FIG. 8 is a view illustrating an implementation example of a flexible printed circuit board according to an embodiment of the disclosure.

FIG. 8 is a view illustrating a process 800 of implementing a flexible printed circuit board 300 according to an embodiment of the disclosure. However, the process 800 of implementing the flexible printed circuit board 300 shown in FIG. 8 is an example and may include more or less operations than those shown. Further, it will be appreciated by one of ordinary skill in the art that the flexible printed circuit board 300 may be implemented without limited to the order of the implementing process.

Figure 9A:
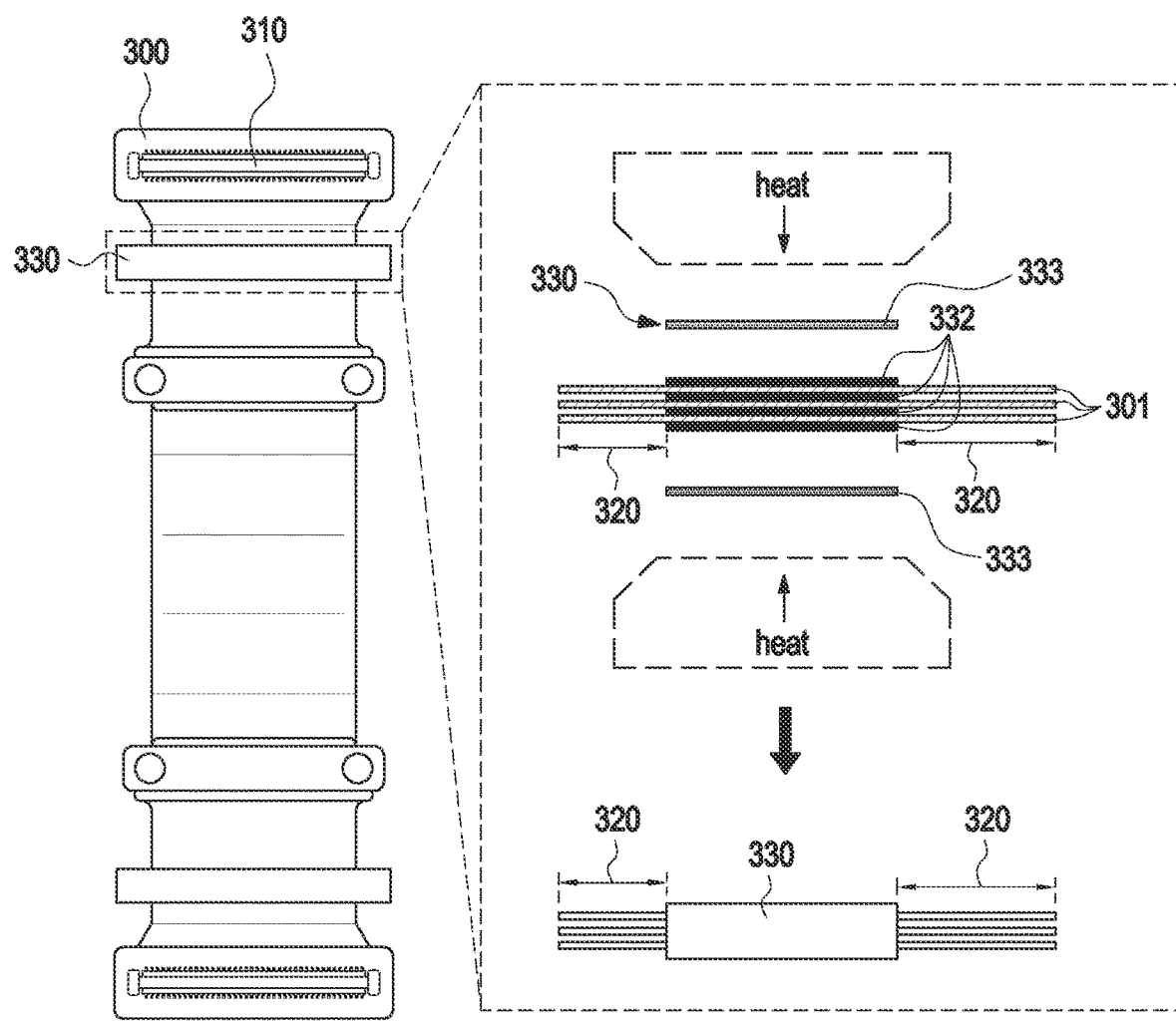
FIG. 9A is a view illustrating an example process of thermocompressing a bonding member disposed between a plurality of layers included in a reinforcement portion of a flexible printed circuit board according to an embodiment of the disclosure.
Figure 9B:
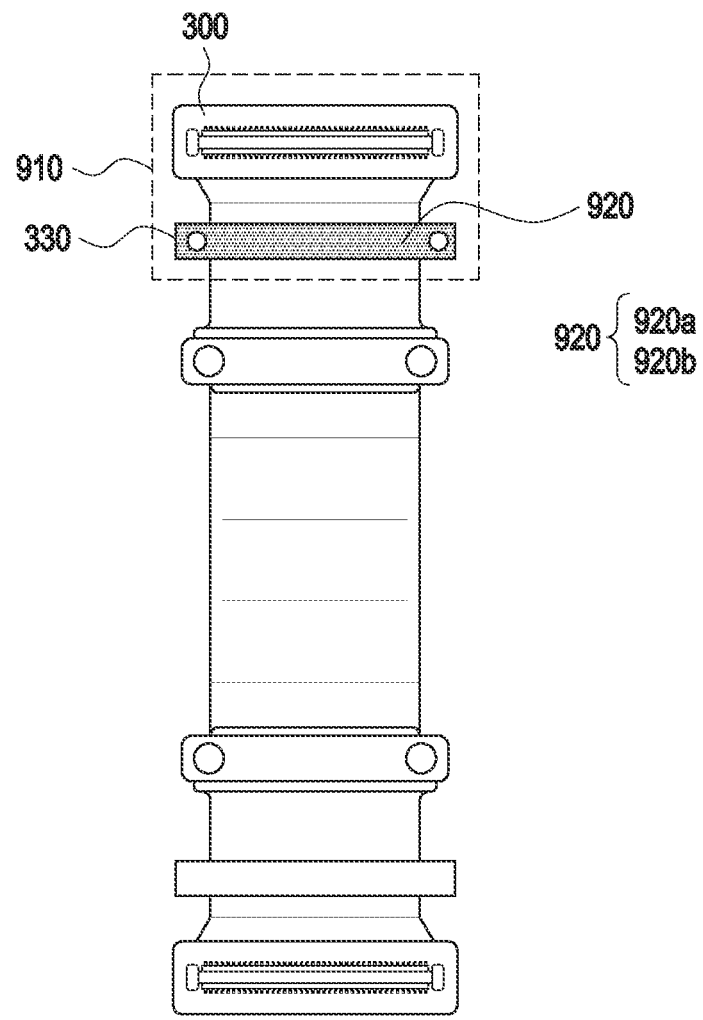
FIG. 9B is a view illustrating an example in which a reinforcing member is disposed on a reinforcement portion of a flexible printed circuit board according to an embodiment of the disclosure.
Figure 9C:
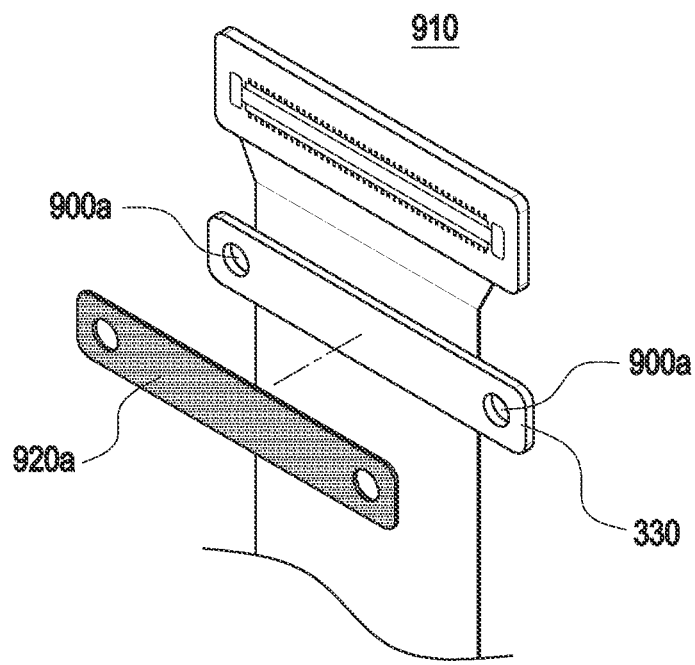
FIG. 9C is a view illustrating an example of a structure for enhancing adhesivity between a reinforcement portion of a flexible printed circuit board, a reinforcing member, and a waterproofing member according to an embodiment of the disclosure.
Figure 9D:
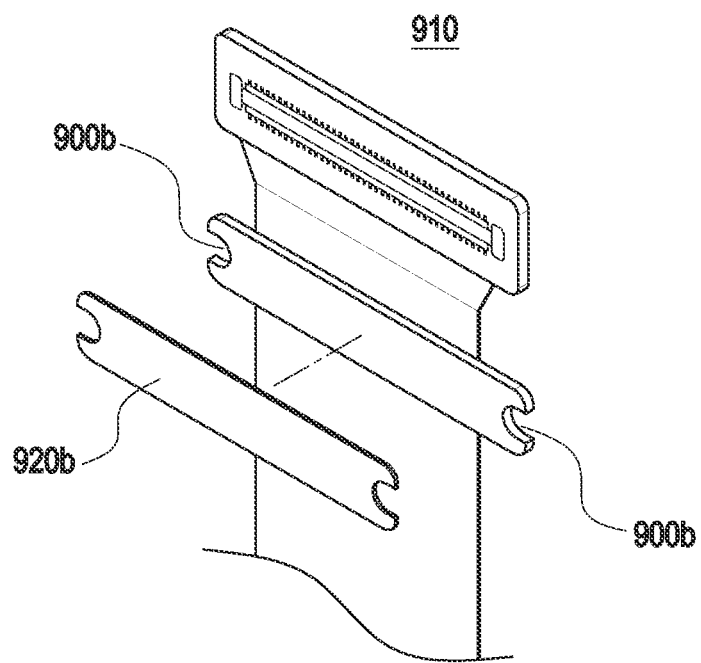
FIG. 9D is a view illustrating another example of a structure for enhancing adhesivity between a reinforcement portion of a flexible printed circuit board, a reinforcing member, and a waterproofing member according to an embodiment of the disclosure.
Figure 9E:
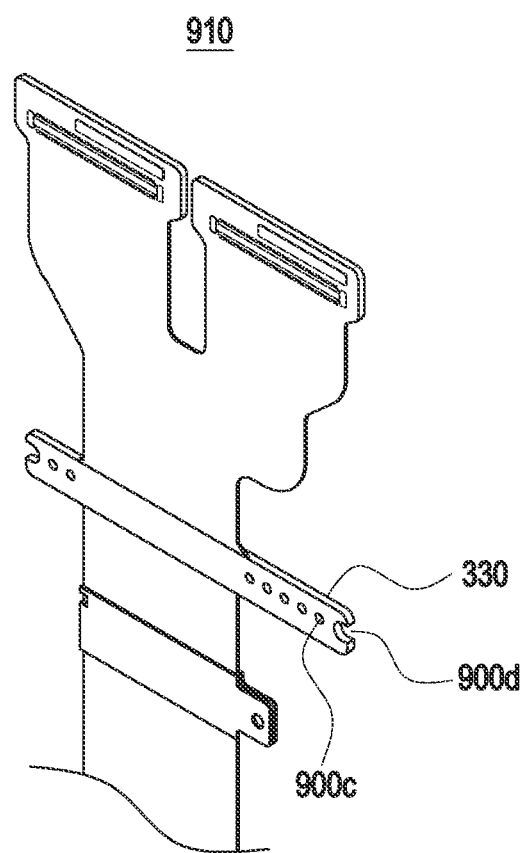
FIG. 9E is a view illustrating another example of a structure for enhancing adhesivity between a reinforcement portion of a flexible printed circuit board, a reinforcing member, and a waterproofing member according to an embodiment of the disclosure.

FIG. 9A is a view illustrating an example process of thermocompressing a bonding member 332 disposed between a plurality of layers 301 included in a reinforcement portion 330 of a flexible printed circuit board 300 according to an embodiment of the disclosure. FIG. 9B is a view illustrating an example in which a reinforcing member is disposed on a reinforcement portion 330 of a flexible printed circuit board 300 according to an embodiment of the disclosure. FIG. 9C is a view illustrating an example of a structure 910 for enhancing adhesivity between a reinforcement portion 320 of a flexible printed circuit board 300, a reinforcing member 920a and 920b, and a waterproofing member 350 according to an embodiment of the disclosure. FIG. 9D is a view illustrating another example of a structure 910 for enhancing adhesivity between a reinforcement portion 320 of a flexible printed circuit board 300, a reinforcing member 920a and 920b, and a waterproofing member 350 according to an embodiment of the disclosure. FIG. 9E is a view illustrating another example of a structure 910 for enhancing adhesivity between a reinforcement portion 320 of a flexible printed circuit board 300, a reinforcing member 920a and 920b, and a waterproofing member 350 according to an embodiment of the disclosure.

According to various embodiments, a reinforcing portion 330 may be formed on at least a portion of a flexible printed circuit board 300 in operation 801. Referring to FIG. 9A, the bonding member 332 (e.g., a tape implemented as an adhesive material) may be disposed between the plurality of layers 301 (e.g., several flexible printed circuit boards 300 or a plurality of layers of a single flexible printed circuit board 300) of a portion of the flexible printed circuit board 300 inserted into the through hole (e.g., the through hole 203 of FIG. 2B, the through hole 510 or 520 of FIGS. 5A and 5B, or the through holes 710 and 720 of FIGS. 7A and 7B), and a predetermined film 333 (or a rigid layer) may be disposed on each of the uppermost layer and lowermost layer of the plurality of layers 301, and a thermocompression process may be performed on the portion of the flexible printed circuit board 300. The reinforcement portion 330 may be formed by the thermocompression process, and the plurality of layers 301 of the reinforcement portion 330 may be bonded together by the bonding member 332 while the gaps between the plurality of layers 301 may be filled. The reinforcement portion 330 may be rendered to have higher rigidity than the rigidity of the other portions (e.g., the wiring portion 320) of the flexible printed circuit board 300 by the rigidity provided after the bonding member 332 is cured. The rest of the reinforcement portion 330 not described is the same as those described above in connection with FIGS. 3A to 3F and, thus, no duplicate description is given.

According to various embodiments, in operation 803, a structure may be formed on the reinforcement portion 330 of the flexible printed circuit board 300 to secure attaching force (or bonding force). For example, a structure for enhancing the bonding force between the waterproofing member 350 and the reinforcing member 920a and 920b described below may be formed. For example, referring to FIGS. 9C and 9D, a predetermined hole structure 900a or an undercut structure 900b may be formed in the dummy area (e.g., the second area Y2) of the reinforcement portion 330. Further, a predetermined hole structure or an undercut structure may also be formed in the area corresponding to the reinforcing member 920a and 920b described below. Accordingly, when the waterproofing member 350 is molded, with the reinforcing member 920a and 920b disposed on the reinforcement portion 330, a portion of the waterproofing member 350 may be molded in the predetermined hole structure 900a or undercut structure 900b. The bonding force between the reinforcement portion 330, the reinforcing member 920a and 920b, and the waterproofing member 350 may be enhanced based on the bonding force between the portion of the waterproofing member 350, inserted into the predetermined hole structure 900a or undercut structure 900b, and the reinforcing member 920a and 920b. Further, referring to FIG. 9E, in a case where there are a plurality of connector portions, and a long reinforcement portion 330 is formed, a plurality of housing structures 900c and/or undercut structures 900d may be formed in the dummy area (e.g., the second area Y2) of the reinforcement portion 330.

According to various embodiments, in operation 805, the reinforcing member 920a and 920b may be disposed on the reinforcement portion 330 of the flexible printed circuit board 300. In a case where the rigidity of the dummy area (e.g., the second area Y2) in which several flexible printed circuit boards are integrated is not sufficient, as shown in FIG. 9B, a reinforcing member 920a and 920b implemented of a high-rigidity material, such as metal (STS) or epoxy sheet, may be disposed on the reinforcement portion 330 to provide more secure rigidity.

Meanwhile, operation 803 may be performed earlier than operation 801. For example, through holes or undercut structures may be formed which pass through the reinforcing member 920a and 920b and the reinforcement portion 330 from the top down, with the reinforcing member 920a and 920b disposed on the reinforcement portion 330.

According to various embodiments, in operation 807, the waterproofing member 350 may be molded on the reinforcement portion 330 on which the reinforcing member 920a and 920b of the flexible printed circuit board 300 is disposed. For example, a predetermined elastic member may be molded on the reinforcement portion 330 on which the reinforcing member 920a and 920b is disposed, thereby forming the waterproofing member 350. Alternatively, without limited to those described, a predetermined elastic member may be molded on the reinforcement portion 330, with no reinforcing member 920a and 920b disposed, and the waterproofing member 350 may be formed. The waterproofing member 350 may be implemented as described above in connection with FIGS. 3A to 3F and, thus, no duplicate description is given.

According to various embodiments, there may be provided an electronic device (e.g., the electronic device 200 of FIG. 2A) comprising a first housing (e.g., the housing 220 of FIG. 2A, the housing structure 410 or 420 of FIGS. 4A to 4C, or the housing structure 610 or 620 of FIGS. 6A to 6C) including a first through hole (e.g., the through hole 203 of FIG. 2B), a flexible printed circuit board (e.g., the flexible printed circuit board 300 of FIGS. 3A to 3F) including a plurality of layers (e.g., the plurality of layers 301 of FIGS. 3A to 3F), a first portion (e.g., the reinforcement portion 330 of FIGS. 3A to 3F) of the flexible printed circuit board (e.g., the flexible printed circuit board 300 of FIGS. 3A to 3F) being disposed to pass through the first through hole (e.g., the through hole 203 of FIG. 2B), a bonding member (e.g., the bonding member 332 of FIGS. 3A to 3F) being disposed between the plurality of layers (e.g., the plurality of layers 301 of FIGS. 3A to 3F) constituting the first portion (e.g., the reinforcement portion 330 of FIGS. 3A to 3F), and a waterproofing member (e.g., the waterproofing member 350 of FIGS. 3A to 3F) formed to surround at least part of the first portion (e.g., the reinforcement portion 330 of FIGS. 3A to 3F) of the flexible printed circuit board (e.g., the flexible printed circuit board 300 of FIGS. 3A to 3F).

According to various embodiments, there may be provided the electronic device (e.g., the electronic device 200 of FIG. 2A) further comprising a rear cover including an upper surface (e.g., the upper surface 220B of FIG. 2A) facing a lower surface (e.g., the lower surface 220A of the upper portion of the housing 220 of FIG. 2A) of an upper portion the housing (e.g., the housing 220 of FIG. 2A, the housing structure 410 or 420 of FIGS. 4A to 4C, or the housing structure 610 or 620 of FIGS. 6A to 6C), wherein a first space (e.g., the waterproof area 201 of FIG. 2A) is formed between the upper surface of the rear cover and the lower surface of the housing (e.g., the housing 220 of FIG. 2A, the housing structure 410 or 420 of FIGS. 4A to 4C, or the housing structure 610 or 620 of FIGS. 6A to 6C), and wherein a first end (e.g., the end 231A of the flexible printed circuit board of FIG. 2A) connected to the first portion (e.g., the reinforcement portion 330 of FIGS. 3A to 3F) of the flexible printed circuit board (e.g., the flexible printed circuit board 300 of FIGS. 3A to 3F) passing through the first through hole (e.g., the through hole 203 of FIG. 2B) is positioned in the first space (e.g., the waterproof area 201 of FIG. 2A).

According to various embodiments, there may be provided the electronic device (e.g., the electronic device 200 of FIG. 2A) further comprising at least one electric component in the first space (e.g., the waterproof area 201 of FIG. 2A), wherein the first end of the flexible printed circuit board (e.g., the flexible printed circuit board 300 of FIGS. 3A to 3F) is electrically connected with the at least one electric component, and wherein the first space (e.g., the waterproof area 201 of FIG. 2A) is waterproofable based on an outer surface of the waterproofing member (e.g., the waterproofing member 350 of FIGS. 3A to 3F) contacting an inner surface of the first through hole (e.g., the through hole 203 of FIG. 2B).

According to various embodiments, there may be provided the electronic device (e.g., the electronic device 200 of FIG. 2A), wherein a ratio of a first width in a first direction of the first portion (e.g., the reinforcement portion 330 of FIGS. 3A to 3F) of the flexible printed circuit board (e.g., the flexible printed circuit board 300 of FIGS. 3A to 3F) to a width in the first direction of the first through hole (e.g., the through hole 203 of FIG. 2B) is implemented to be larger than a first value and smaller than a second value.

According to various embodiments, there may be provided the electronic device (e.g., the electronic device 200 of FIG. 2A), wherein a first width in a first direction of the first portion (e.g., the reinforcement portion 330 of FIGS. 3A to 3F) of the flexible printed circuit board (e.g., the flexible printed circuit board 300 of FIGS. 3A to 3F) is implemented in proportion to a width in the first direction of the first end (e.g., the end 231A of the flexible printed circuit board of FIG. 2A or the connector portion 310 of FIGS. 3A and 3B) of the flexible printed circuit board (e.g., the flexible printed circuit board 300 of FIGS. 3A to 3F) and/or the first through hole (e.g., the through hole 203 of FIG. 2B).

According to various embodiments, there may be provided the electronic device (e.g., the electronic device 200 of FIG. 2A), wherein the first width in the first direction of the first portion (e.g., the reinforcement portion 330 of FIGS. 3A to 3F) of the flexible printed circuit board (e.g., the flexible printed circuit board 300 of FIGS. 3A to 3F) is larger than a second width in the first direction of remaining at least part of the flexible printed circuit board (e.g., the flexible printed circuit board 300 of FIGS. 3A to 3F).

According to various embodiments, there may be provided the electronic device (e.g., the electronic device 200 of FIG. 2A), wherein a length, in a second direction perpendicular to the first direction, of the first portion (e.g., the reinforcement portion 330 of FIGS. 3A to 3F) of the flexible printed circuit board (e.g., the flexible printed circuit board 300 of FIGS. 3A to 3F) is larger than a length in the second direction of the waterproofing member (e.g., the waterproofing member 350 of FIGS. 3A to 3F).

According to various embodiments, there may be provided the electronic device (e.g., the electronic device 200 of FIG. 2A), wherein the second portion (e.g., the wiring portion 320 of FIGS. 3A to 3E) of the flexible printed circuit board (e.g., the flexible printed circuit board 300 of FIGS. 3A to 3F) having the second width is a portion extending from the at least part of the flexible printed circuit board (e.g., the flexible printed circuit board 300 of FIGS. 3A to 3F) in a direction outward of the first space (e.g., the waterproof area 201 of FIG. 2A) or a portion extending in a direction inward of the first space (e.g., the waterproof area 201 of FIG. 2A).

According to various embodiments, there may be provided the electronic device (e.g., the electronic device 200 of FIG. 2A) further comprising a second housing (e.g., the housing 220 of FIG. 2A, the housing structure 410 or 420 of FIGS. 4A to 4C, or the housing structure 610 or 620 of FIGS. 6A to 6C) including a second through hole (e.g., the through hole 203 of FIG. 2B), the second portion (e.g., the wiring portion 320 of FIGS. 3A to 3E) of the flexible printed circuit board (e.g., the flexible printed circuit board 300 of FIGS. 3A to 3F) having the second width is positioned between the first portion (e.g., the reinforcement portion 330 of FIGS. 3A to 3F) of the flexible printed circuit board (e.g., the flexible printed circuit board 300 of FIGS. 3A to 3F) passing through the first through hole (e.g., the through hole 203 of FIG. 2B) and a third portion of the flexible printed circuit board (e.g., the flexible printed circuit board 300 of FIGS. 3A to 3F) passing through the second through hole (e.g., the through hole 203 of FIG. 2B).

According to various embodiments, there may be provided the electronic device (e.g., the electronic device 200 of FIG. 2A) further comprising a flexible display (e.g., the flexible display 403 of FIGS. 4A to 4C or the flexible display 630 of FIGS. 6A to 6C) disposed on the housing (e.g., the housing 220 of FIG. 2A, the housing structure 410 or 420 of FIGS. 4A to 4C, or the housing structure 610 or 620 of FIGS. 6A to 6C) and the first housing (e.g., the housing 220 of FIG. 2A, the housing structure 410 or 420 of FIGS. 4A to 4C, or the housing structure 610 or 620 of FIGS. 6A to 6C), wherein the remaining at least part of the flexible printed circuit board (e.g., the flexible printed circuit board 300 of FIGS. 3A to 3F) having the second width is a portion disposed in at least part of a second space (e.g., the non-waterproof area 202 of FIG. 2B) between the first housing (e.g., the housing 220 of FIG. 2A, the housing structure 410 or 420 of FIGS. 4A to 4C, or the housing structure 610 or 620 of FIGS. 6A to 6C) and the housing (e.g., the housing 220 of FIG. 2A, the housing structure 410 or 420 of FIGS. 4A to 4C, or the housing structure 610 or 620 of FIGS. 6A to 6C) and the flexible display (e.g., the flexible display 403 of FIGS. 4A to 4C or the flexible display 630 of FIGS. 6A to 6C).

According to various embodiments, there may be provided the electronic device (e.g., the electronic device 200 of FIG. 2A), wherein the plurality of layers (e.g., the plurality of layers 301 of FIGS. 3A to 3F) of the at least part of the flexible printed circuit board (e.g., the flexible printed circuit board 300 of FIGS. 3A to 3F) include a first area (e.g., the first area Y1 of FIG. 3C) in which at least one wire is disposed and a second area (e.g., the second area Y2 of FIG. 3C) other than the first area (e.g., the first area Y1 of FIG. 3C), and wherein the second area (e.g., the second area Y2 of FIG. 3C) is positioned between the first area (e.g., the first area Y1 of FIG. 3C) and an inner surface of the waterproofing member (e.g., the waterproofing member 350 of FIGS. 3A to 3F).

According to various embodiments, there may be provided the electronic device (e.g., the electronic device 200 of FIG. 2A), wherein the first width in the first direction of the at least part of the flexible printed circuit board (e.g., the flexible printed circuit board 300 of FIGS. 3A to 3F) is larger than the second width of the remaining at least part of the flexible printed circuit board 300 of FIGS. 3A to 3F) by the width in the first direction of the second area (e.g., the second area Y2 of FIG. 3C).

According to various embodiments, there may be provided the electronic device (e.g., the electronic device 200 of FIG. 2A), wherein the bonding member (e.g., the bonding member 332 of FIGS. 3A to 3F) is implemented as a bonding layer (e.g., the bonding layer 332 of FIG. 3C) filling a gap between the plurality of layers (e.g., the plurality of layers 301 of FIGS. 3A to 3F).

According to various embodiments, there may be provided the electronic device (e.g., the electronic device 200 of FIG. 2A), wherein the at least part of the flexible printed circuit board (e.g., the flexible printed circuit board 300 of FIGS. 3A to 3F) is larger in rigidity than the remaining at least part of the flexible printed circuit board (e.g., the flexible printed circuit board 300 of FIGS. 3A to 3F) based on the bonding layer.

According to various embodiments, there may be provided the electronic device (e.g., the electronic device 200 of FIG. 2A) further comprising a reinforcing member (e.g., the reinforcing member 920a or 920b of FIGS. 9C and 9D) disposed on the at least part of the flexible printed circuit board (e.g., the flexible printed circuit board 300 of FIGS. 3A to 3F), wherein the waterproofing member (e.g., the waterproofing member 350 of FIGS. 3A to 3F) is disposed to surround the reinforcing member (e.g., the reinforcing member 920a or 920b of FIGS. 9C and 9D).

According to various embodiments, there may be provided the electronic device (e.g., the electronic device 200 of FIG. 2A), wherein a predetermined structure is formed to pass through, from top down, each of at least one first area of the first portion (e.g., the reinforcement portion 330 of FIGS. 3A to 3F) of the flexible printed circuit board (e.g., the flexible printed circuit board 300 of FIGS. 3A to 3F) and at least one second area corresponding to the reinforcing member (e.g., the reinforcing member 920a or 920b of FIGS. 9C and 9D), and wherein the reinforcing member (e.g., the reinforcing member 920a or 920b of FIGS. 9C and 9D) is disposed in the predetermined structure to contact an inner surface of the first portion (e.g., the reinforcement portion 330 of FIGS. 3A to 3F) in the predetermined structure and an inner surface of the reinforcing member.

According to various embodiments, there may be provided an electronic device (e.g., the electronic device 400 of FIGS. 4A to 4C or the electronic device 600 of FIGS. 6A to 6C) comprising a first housing (e.g., the housing structure 410 of FIGS. 4A to 4C) including a first through hole (e.g., the through hole 510 of FIGS. 5A and 5B), a second housing (e.g., the second housing structure 420 of FIGS. 4A to 4C) including a second through hole (e.g., the through hole 520 of FIGS. 5A and 5B), a flexible printed circuit board (e.g., the flexible printed circuit board 300 of FIGS. 3A to 3F) (FPCB) including a plurality of layers (e.g., the plurality of layers 301 of FIGS. 3A to 3F) and including a first portion (e.g., the reinforcement portion 330 of FIGS. 3A to 3F) passing through the first through hole (e.g., the through hole 510 of FIGS. 5A and 5B) and a second portion passing through the second through hole (e.g., the through hole 520 of FIGS. 5A and 5B), a bonding member (e.g., the bonding member 332 of FIGS. 3A to 3F) being disposed between the plurality of layers (e.g., the plurality of layers 301 of FIGS. 3A to 3F) of the first portion and the second portion (e.g., the reinforcement portions 330a and 330b of FIGS. 3A to 3F), a first waterproofing member (e.g., the waterproofing member 350 of FIGS. 3A to 3F) formed to surround the at least first portion (e.g., the reinforcement portion 330 of FIGS. 3A to 3F) of the flexible printed circuit board (e.g., the flexible printed circuit board 300 of FIGS. 3A to 3F), and a second waterproofing member (e.g., the waterproofing member 350 of FIGS. 3A to 3F) formed to surround the at least second portion of the flexible printed circuit board (e.g., the flexible printed circuit board 300 of FIGS. 3A to 3F).

According to various embodiments, there may be provided the electronic device (e.g., the electronic device 400 of FIGS. 4A to 4C or the electronic device 600 of FIGS. 6A to 6C), wherein a first width of the first portion (e.g., the reinforcement portion 330 of FIGS. 3A to 3F) of the flexible printed circuit board (e.g., the flexible printed circuit board 300 of FIGS. 3A to 3F) and a second width of the second portion are larger than a third width of a third portion of the flexible printed circuit board (e.g., the flexible printed circuit board 300 of FIGS. 3A to 3F) between the first portion and the second portion (e.g., the reinforcement portions 330a and 330b of FIGS. 3A to 3F).

According to various embodiments, there may be provided the electronic device (e.g., the electronic device 400 of FIGS. 4A to 4C or the electronic device 600 of FIGS. 6A to 6C), wherein the plurality of layers (e.g., the plurality of layers 301 of FIGS. 3A to 3F) of each of the first portion and the second portion (e.g., the reinforcement portions 330a and 330b of FIGS. 3A to 3F) of the flexible printed circuit board (e.g., the flexible printed circuit board 300 of FIGS. 3A to 3F) include a first area in which at least one wire is disposed and a second area other than the first area.

According to various embodiments, there may be provided the electronic device (e.g., the electronic device 400 of FIGS. 4A to 4C or the electronic device 600 of FIGS. 6A to 6C), wherein each of the first width and the second width in the first direction is larger than the third width by the width in the first direction of the second area, and wherein the first direction is a direction in which the first through hole and the second through hole are longer.

According to various embodiments, there may be provided the electronic device (e.g., the electronic device 400 of FIGS. 4A to 4C or the electronic device 600 of FIGS. 6A to 6C), wherein the bonding member (e.g., the bonding member 332 of FIGS. 3A to 3F) is implemented as a bonding layer (e.g., the bonding layer 332 of FIG. 3C) filling a gap between the plurality of layers (e.g., the plurality of layers 301 of FIGS. 3A to 3F).

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
a first housing including a first through hole;
a flexible printed circuit board including:
  a first portion of the flexible printed circuit board that includes a plurality of layers and is disposed to pass through the first through hole,
  a second portion of the flexible printed circuit board that includes the plurality of layers and extends from a first end of the first portion of the flexible printed circuit board, and
  a third portion of the flexible printed circuit board that includes the plurality of layers and extends from a second end of the first portion of the flexible printed circuit board;
a bonding member being disposed between the plurality of layers in the first portion of the flexible printed circuit board from the first end of the first portion of the flexible printed circuit board to the second end of the first portion of the flexible printed circuit board; and
a waterproofing member formed to surround at least part of the first portion of the flexible printed circuit board,
wherein the first portion of the flexible printed circuit board is greater in rigidity than at least one of the second portion of the flexible printed circuit board or the third portion of the flexible printed circuit board, based at least in part on the bonding member.

2. The electronic device of claim 1, further comprising:
a rear cover including an upper surface facing a lower surface of the first housing,
wherein a first space is formed between the upper surface of the rear cover and the lower surface of the first housing, and
wherein the first end of the first portion of the flexible printed circuit board is connected to the second portion of the flexible printed circuit board and is positioned in the first space.

3. The electronic device of claim 2, further comprising:
at least one electric component in the first space,
wherein the first end of the first portion of the flexible printed circuit board is electrically connected with the at least one electric component via the second portion of the flexible printed circuit board, and
wherein the first space is waterproofable based on an outer surface of the waterproofing member contacting an inner surface of the first through hole.

4. The electronic device of claim 3, wherein a first width corresponding to the first portion of the flexible printed circuit board is in proportion to a second width corresponding to at least one of the first end of the first portion of the flexible printed circuit board or the first through hole.

5. The electronic device of claim 4, wherein the first width is greater than a third width corresponding to at least one of the second portion of the flexible printed circuit board or the third portion of the flexible printed circuit board.

6. The electronic device of claim 5, wherein a length of the first portion of the flexible printed circuit board between the second portion of the flexible printed circuit board and the third portion of the flexible printed circuit board, is greater than a dimension of the waterproofing member that is parallel to the length of the first portion of the flexible printed circuit board.

7. The electronic device of claim 5,
wherein the second portion of the flexible printed circuit board is disposed inside of the first space, and
wherein the third portion of the flexible printed circuit board is disposed outside of the first space.

8. The electronic device of claim 5, further comprising:
a second housing including a second through hole,
wherein the third portion of the flexible printed circuit board is positioned between the first portion of the flexible printed circuit board passing through the first through hole and a fourth portion of the flexible printed circuit board passing through the second through hole.

9. The electronic device of claim 8, further comprising:
a flexible display disposed on the first housing and the second housing,
wherein the third portion of the flexible printed circuit board is disposed in at least part of a second space between the first housing and the second housing, and the flexible display.

10. The electronic device of claim 5,
wherein the plurality of layers in the first portion of the flexible printed circuit board include a first area corresponding to a first part of the first width in which at least one wire is disposed and a second area other than the first area corresponding to at least a second part of the first width, and wherein the second area is positioned between the first area and an inner surface of the waterproofing member.

11. The electronic device of claim 10, wherein the first width is greater than the second width by a fourth width corresponding to the second area.

12. The electronic device of claim 1, wherein the bonding member is implemented as at least one bonding layer filling a gap between the plurality of layers in the first portion of the flexible printed circuit board from the first end of the first portion of the flexible printed circuit board to the second end of the first portion of the flexible printed circuit board.

13. The electronic device of claim 5, further comprising:
a reinforcing member disposed on the at least part of the first portion the flexible printed circuit board,
wherein the waterproofing member is disposed to surround the reinforcing member.

14. The electronic device of claim 13,
wherein at least one predetermined structure is formed to pass through corresponding areas of the first portion of the flexible printed circuit board and the reinforcing member, and
wherein a portion of the waterproofing member is disposed in the at least one predetermined structure to contact surfaces of the first portion of the flexible printed circuit board and the reinforcing member forming the at least one predetermined structure.

15. An electronic device comprising:
a first housing including a first through hole;
a second housing including a second through hole;
a flexible printed circuit board including:
a first portion of the flexible printed circuit board that includes a plurality of layers and is disposed to pass through the first through hole,
a second portion of the flexible printed circuit board that includes the plurality of layers and extends from a first end of the first portion of the flexible printed circuit board,
a third portion of the flexible printed circuit board that includes the plurality of layers and extends from a second end of the first portion of the flexible printed circuit board,
a fourth portion of the flexible printed circuit board that includes the plurality of layers and is disposed to pass through the second through hole, the third portion of the flexible printed circuit board extends from a first end of the fourth portion of the flexible printed circuit board, and a fifth portion of the flexible printed circuit board that includes the plurality of layers and extends from a second end of the fourth portion of the flexible printed circuit board;
a first bonding member disposed between the plurality of layers in the first portion of the flexible printed circuit board from the first end of the first portion of the flexible printed circuit board to the second end of the first portion of the flexible printed circuit board;
a second bonding member disposed between the plurality of layers in the fourth portion of the flexible printed circuit board from the first end of the fourth portion of the flexible printed circuit board to the second end of the fourth portion of the flexible printed circuit board;
a first waterproofing member formed to surround at least part of the first portion of the flexible printed circuit board; and
a second waterproofing member formed to surround at least part of the second portion of the flexible printed circuit board,
wherein the first portion of the flexible printed circuit board is greater in rigidity than at least one of the second portion of the flexible printed circuit board or the third portion of the flexible printed circuit board, based at least in part on the first bonding member, and
wherein the fourth portion of the flexible printed circuit board is greater in rigidity than at least one of the third portion of the flexible printed circuit board or the fifth portion of the flexible printed circuit board, based at least in part on the second bonding member.

16. The electronic device of claim 15, wherein the first bonding member and the second bonding member each include a tape formed as an adhesive material.

17. The electronic device of claim 15, wherein the first waterproofing member and the second waterproofing member each form at least one barrier.

18. The electronic device of claim 15, wherein the plurality of layers includes a single flexible printed circuit board or a plurality of overlapping flexible printed circuit boards.

19. The electronic device of claim 15, wherein the plurality of layers included in the first portion and fourth portion of the flexible printed circuit board are disposed between an uppermost layer and a lowermost layer that each include a rigid film.

20. The electronic device of claim 1, wherein the plurality of layers included in the first portion of the flexible printed circuit board are disposed between an uppermost layer and a lowermost layer that each include a rigid film.

* * * * *